(12) United States Patent
Shang et al.

(10) Patent No.: US 12,317,716 B2
(45) Date of Patent: May 27, 2025

(54) DISPLAY PANEL, METHOD FOR MANUFACTURING THE SAME AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Tinghua Shang, Beijing (CN); Yang Zhou, Beijing (CN); Pengfei Yu, Beijing (CN); Zhengwei Luo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 631 days.

(21) Appl. No.: 17/637,248

(22) PCT Filed: Apr. 15, 2021

(86) PCT No.: PCT/CN2021/087372
§ 371 (c)(1),
(2) Date: Feb. 22, 2022

(87) PCT Pub. No.: WO2021/238478
PCT Pub. Date: Dec. 2, 2021

(65) Prior Publication Data
US 2022/0285458 A1    Sep. 8, 2022

(30) Foreign Application Priority Data

May 27, 2020 (CN) .......................... 202010461694.4

(51) Int. Cl.
*H01L 27/32* (2006.01)
*H10K 59/121* (2023.01)
(Continued)

(52) U.S. Cl.
CPC ....... *H10K 59/353* (2023.02); *H10K 59/1213* (2023.02); *H10K 59/122* (2023.02); *H10K 59/131* (2023.02)

(58) Field of Classification Search
None
See application file for complete search history.

(56) References Cited

U.S. PATENT DOCUMENTS

| | | | |
|---|---|---|---|
| 2021/0020869 A1* | 1/2021 | Xie | H10K 59/879 |
| 2024/0206268 A1* | 6/2024 | Yu | H10K 59/131 |
| 2024/0268172 A1* | 8/2024 | Zhang | H10K 59/35 |

FOREIGN PATENT DOCUMENTS

| | | |
|---|---|---|
| CN | 108565358 A | 9/2018 |
| CN | 109671762 A | 4/2019 |

(Continued)

OTHER PUBLICATIONS

PCT/CN2021/087372 international search report and written opinion.

*Primary Examiner* — Long Pham
(74) *Attorney, Agent, or Firm* — IPro, PLLC

(57) ABSTRACT

A display panel includes a substrate, and a plurality of pixel units arranged on the substrate in an array form and each including a plurality of subpixels. Each subpixel includes a subpixel driving circuitry, a planarization layer and an anode pattern laminated one on another, each anode pattern of at least a part of the subpixels includes a middle portion and a peripheral portion surrounding the middle portion, a groove is formed in a surface of the planarization layer away from the substrate, an orthogonal projection of the groove onto the substrate surrounds an orthogonal projection of the middle portion onto the substrate, and at least a part of an orthogonal projection of the peripheral portion onto the substrate is located within the orthogonal projection of the groove onto the substrate.

20 Claims, 13 Drawing Sheets

(51) Int. Cl.
*H10K 59/122* (2023.01)
*H10K 59/131* (2023.01)
*H10K 59/35* (2023.01)

(56) References Cited

FOREIGN PATENT DOCUMENTS

| | | |
|---|---|---|
| CN | 109950295 A | 6/2019 |
| CN | 111584599 A | 8/2020 |

\* cited by examiner

DISPLAY PANEL, METHOD FOR MANUFACTURING THE SAME AND DISPLAY DEVICE

CROSS-REFERENCE TO RELATED APPLICATION

This application is the U.S. national phase of PCT Application No. PCT/CN2021/087372 filed on Apr. 15, 2021, which claims a priority of the Chinese patent application No. 202010461694.4 filed on May 27, 2020, which is incorporated herein by reference in its entirety.

TECHNICAL FIELD

The present disclosure relates to the field of display technology, in particular to a display panel, a method for manufacturing the display panel, and a display device.

BACKGROUND

In an Organic Light-Emitting Diode (OLED) display product, a light-emitting functional layer is arranged at a side of an anode layer away from a substrate of a display panel, and a planarization layer is arranged at a side of the anode layer facing the substrate. Usually, the planarization layer is made of a polyimide organic polymer, and a polyimide polymer material is formed through the polymerization of oligomers. During the polymerization, a by-product is water, and polyimide further has a water absorption property to some extent.

During the manufacture of the display panel, the planarization layer is covered by the anode layer with a dense structure, and it is impossible to completely remove molecules of water in the planarization layer through a conventional heating method. Hence, in use, the molecules of water escape from the planarization layer to erode the light-emitting functional layer, thereby a service life of the display product is shortened.

SUMMARY

An object of the present disclosure is to provide a display panel, a method for manufacturing the display panel and a display device.

In order to achieve the above object, the present disclosure provides the following technical solutions.

In a first aspect, the present disclosure provides in some embodiments a display panel, including a substrate, and a plurality of pixel units arranged on the substrate in an array form and each including a plurality of subpixels. Each subpixel includes a subpixel driving circuitry, a planarization layer and an anode pattern laminated one on another in a direction away from the substrate, each anode pattern of at least a part of the subpixels includes a middle portion and a peripheral portion surrounding the middle portion, a groove is formed in a surface of the planarization layer away from the substrate, an orthogonal projection of the groove onto the substrate surrounds an orthogonal projection of the middle portion onto the substrate, and at least a part of an orthogonal projection of the peripheral portion onto the substrate is located within the orthogonal projection of the groove onto the substrate.

In a possible embodiment of the present disclosure, the groove includes a groove bottom and a groove wall, and the orthogonal projection of the peripheral portion onto the substrate overlaps an orthogonal projection of the groove bottom of the groove onto the substrate.

In a possible embodiment of the present disclosure, each subpixel further includes a compensation pattern arranged at a side of the planarization layer facing the substrate, and an orthogonal projection of the compensation pattern onto the substrate overlaps at least a part of the orthogonal projection of the groove in the planarization layer onto the substrate.

In a possible embodiment of the present disclosure, the orthogonal projection of the compensation pattern onto the substrate overlaps the orthogonal projection of the middle portion of the anode pattern onto the substrate.

In a possible embodiment of the present disclosure, each pixel unit includes a red subpixel, a blue subpixel and a green subpixel, the red subpixel and the green subpixel are arranged in a same column in a second direction, and the blue subpixel is arranged in another column. The green subpixel includes: a first power source signal line pattern, at least a part of the first power source signal line pattern extending in the second direction; a first compensation pattern coupled to the first power source signal line pattern and extending in a first direction, the first direction crossing the second direction; and a first planarization layer, a first groove of a rectangular shape being formed in the first planarization layer, the first groove including a first portion and a second portion arranged opposite to each other in the second direction and a third portion and a fourth portion arranged opposite to each other in the first direction, an orthogonal projection of the first portion onto the substrate overlapping an orthogonal projection of the first compensation pattern onto the substrate.

In a possible embodiment of the present disclosure, each pixel unit include a red subpixel, a blue subpixel and a green subpixel, the red subpixel and the green subpixel are arranged in a same column in a second direction, and the blue subpixel is arranged in another column. The blue subpixel includes: a second power source signal line pattern, at least a part of the second power source signal line pattern extending in the second direction; a second compensation pattern coupled to the second power source signal line pattern, protruding from the second power source signal line pattern in a first direction, and extending in the second direction; and a second planarization layer, a second groove of a rectangular shape being formed in the second planarization layer, the second groove including a fifth portion and a sixth portion arranged opposite to each other in the second direction and a seventh portion and an eighth portion arranged opposite to each other in the first direction, an orthogonal projection of the seventh portion onto the substrate overlapping an orthogonal projection of the second compensation pattern onto the substrate.

In a possible embodiment of the present disclosure, each subpixel includes a power source signal line pattern, at least a part of the power source signal line pattern extends in a second direction, the power source signal line pattern includes a first power source member and a second power source member, the first power source member has a width greater than the second power source member in a direction perpendicular to the second direction, and an orthogonal projection of the first power source member onto the substrate overlaps the orthogonal projection of the middle portion of the anode pattern onto the substrate.

In a possible embodiment of the present disclosure, each subpixel further includes: a power source signal line pattern, at least a part of the power source signal line pattern extending in a second direction; and a data line pattern, at least a part of the data line pattern extending in the second direction. The subpixel driving circuitry includes a driving transistor, and in one subpixel, an orthogonal projection of the power source signal line pattern onto the substrate is located between an orthogonal projection of an output electrode of the driving transistor onto the substrate and an orthogonal projection of the data line pattern onto the substrate. The orthogonal projection of the power source signal line pattern onto the substrate overlaps the orthogonal projection of the groove in the planarization layer onto the substrate, and/or overlaps the orthogonal projection of the middle portion of the anode pattern onto the substrate. The orthogonal projection of the data line pattern onto the substrate overlaps the orthogonal projection of the groove in the planarization layer onto the substrate, and/or overlaps the orthogonal projection of the middle portion of the anode pattern onto the substrate.

In a possible embodiment of the present disclosure, each subpixel further includes a first conductive connection member, and at least a part of the first conductive connection member extends in a second direction. The subpixel driving circuitry includes a driving transistor and a first transistor, a first electrode of the first transistor is coupled to a second electrode of the driving transistor, and a second electrode of the first transistor is coupled to a gate electrode of the driving transistor through the first conductive connection member. An orthogonal projection of the first conductive connection member onto the substrate overlaps the orthogonal projection of the groove in the planarization layer onto the substrate, and/or overlaps the orthogonal projection of the middle portion of the anode pattern onto the substrate.

In a possible embodiment of the present disclosure, each subpixel further includes: a second conductive connection member, at least a part of the second conductive connection member extending in a second direction; an initialization signal line pattern, at least a part of the initialization signal line pattern extending in a first direction crossing the second direction; and a resetting signal line pattern extending in the first direction. The subpixel driving circuitry includes a seventh transistor, a gate electrode of which is coupled to the corresponding resetting signal line pattern, a first electrode of which is coupled to the corresponding initialization signal line pattern through the second conductive connection member, and a second electrode of which is coupled to the corresponding anode pattern. An orthogonal projection of the second conductive connection member onto the substrate overlaps the orthogonal projection of the groove in the planarization layer onto the substrate, and/or overlaps the orthogonal projection of the middle portion of the anode pattern onto the substrate.

In a possible embodiment of the present disclosure, each subpixel further includes a pixel definition layer arranged at a side of the anode pattern away from the substrate and provided with a pixel opening, and an orthogonal projection of the pixel opening onto the substrate is located within the orthogonal projection of the anode pattern onto the substrate.

In a possible embodiment of the present disclosure, the subpixels are arranged in an array form. Each subpixel further includes a power source signal line pattern, a data line pattern, an initialization signal line pattern, a gate line pattern, a light-emission control signal line pattern, a resetting signal line pattern and a first conductive connection member. The subpixel driving circuitry includes a driving transistor, a first transistor, a second transistor, a fourth transistor, a fifth transistor, a sixth transistor and a seventh transistor. A gate electrode of the driving transistor is coupled to a second electrode of the first transistor through the corresponding first conductive connection member, a first electrode of the driving transistor is coupled to a second electrode of the fifth transistor, and a second electrode of the driving transistor is coupled to a first electrode of the first transistor. A gate electrode of the first transistor is coupled to the gate line pattern. A gate electrode of the second transistor is coupled to the resetting signal line pattern in a next adjacent subpixel in a second direction, a first electrode of the second transistor is coupled to the initialization signal line pattern in the next adjacent subpixel in the second direction, and a second electrode of the second transistor is coupled to the gate electrode of the driving transistor. A gate electrode of the fourth transistor is coupled to the gate line pattern, a first electrode of the fourth transistor is coupled to the data line pattern, and a second electrode of the fourth transistor is coupled to the first electrode of the driving transistor. A gate electrode of the fifth transistor is coupled to the light-emission control signal line pattern, and a first electrode of the fifth transistor is coupled to the power source signal line pattern. A gate electrode of the sixth transistor is coupled to the light-emission control signal line pattern, a first electrode of the sixth transistor is coupled to the second electrode of the driving transistor, and a second electrode of the sixth transistor is coupled to a light-emitting element of the subpixel. A gate electrode of the seventh transistor is coupled to the corresponding resetting signal line pattern, a first electrode of the seventh transistor is coupled to the corresponding initialization signal line pattern, and a second electrode of the seventh transistor is coupled to the corresponding anode pattern.

In a second aspect, the present disclosure provides in some embodiments a display device, including the above-mentioned display panel.

In a third aspect, the present disclosure provides in some embodiments a method for manufacturing a display panel, including forming a plurality of pixel units on a substrate, the plurality of pixel units being arranged in an array form, each pixel unit including a plurality of subpixels. Each subpixel includes a subpixel driving circuitry, a planarization layer and an anode pattern laminated one on another in a direction away from the substrate, each anode pattern of at least a part of the subpixels includes a middle portion and a peripheral portion surrounding the middle portion, a groove is formed in a surface of the planarization layer away from the substrate, an orthogonal projection of the groove onto the substrate surrounds an orthogonal projection of the middle portion onto the substrate, and at least a part of an orthogonal projection of the peripheral portion onto the substrate is located within the orthogonal projection of the groove onto the substrate.

In a possible embodiment of the present disclosure, each subpixel includes a power source signal line pattern and a compensation pattern. The method further includes forming the power source signal line pattern and the compensation pattern simultaneously through a single patterning process. The compensation pattern is arranged at a surface of the planarization layer facing the substrate, and an orthogonal projection of the compensation pattern onto the substrate overlaps at least a part of the orthogonal projection of the groove in the planarization layer onto the substrate, and/or overlaps the orthogonal projection of the middle portion of the anode pattern onto the substrate.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

The present disclosure will be described hereinafter in conjunction with the drawings and embodiments.

Figure 3:
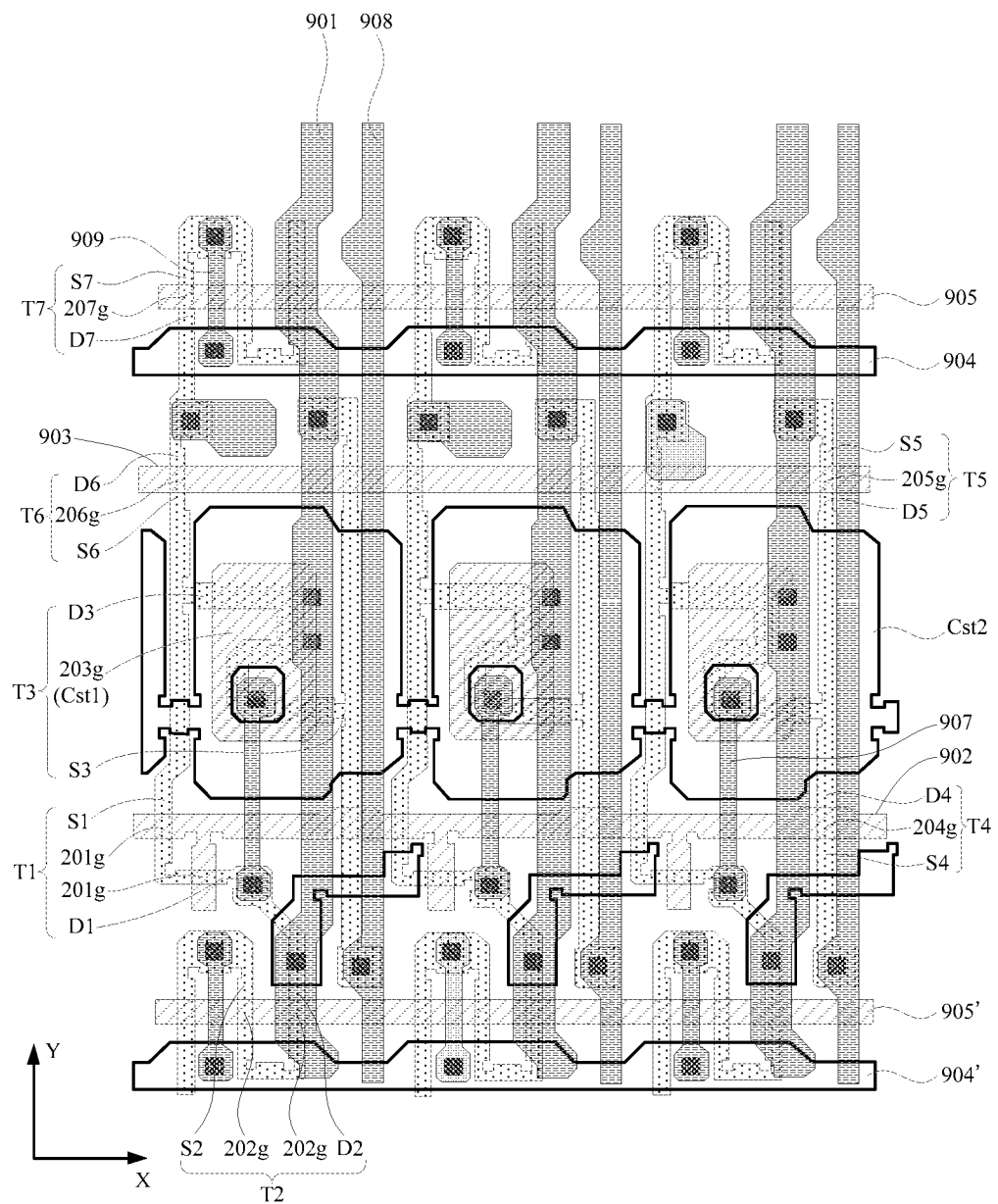
FIG. 3 is a schematic view showing the arrangement of three subpixel driving circuitries according to one embodiment of the present disclosure.
Figure 8:
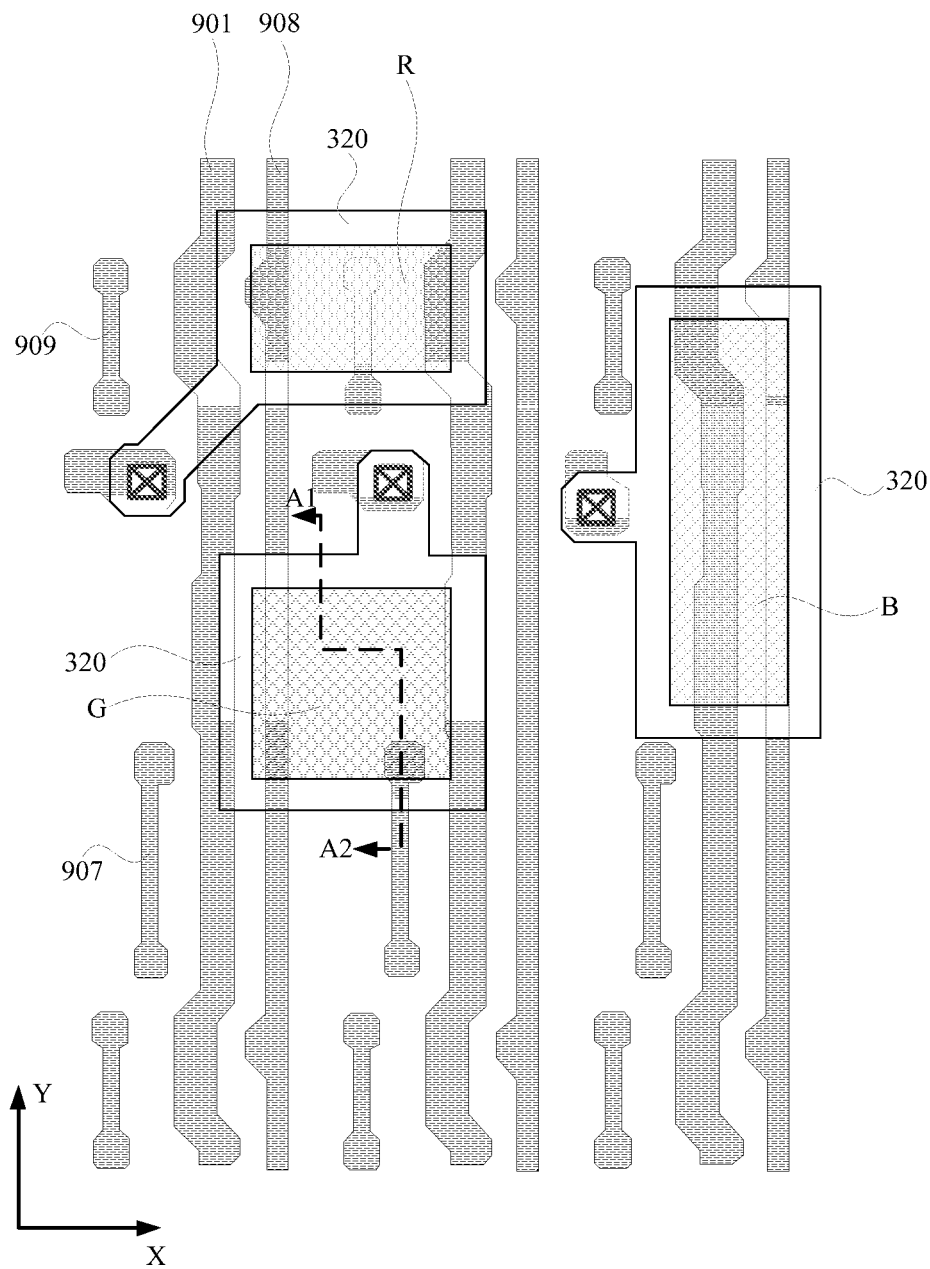
FIG. 8 is a schematic view showing the arrangement of an anode pattern and the source/drain metal layer in FIG. 3.

As shown in FIGS. 3 and 8, the present disclosure provides in some embodiments a display panel, which includes a plurality of pixel units arranged in an array form and each including a plurality of subpixels. Each subpixel includes a subpixel driving circuitry, a power source signal line pattern 901, a data line pattern 908, a gate line pattern 902, a light-emission control signal line pattern 903, a resetting signal line pattern 905, an initialization signal line pattern 904 and an anode pattern 320. At least a part of the power source signal line pattern 901 and the data line pattern 908 extend in a second direction. The gate line pattern 902, the light-emission control signal line pattern 903, the resetting signal line pattern 905 and the initialization signal line pattern 904 extend in a first direction crossing the second direction. Illustratively, the first direction includes a direction X and the second direction includes a direction Y.

As shown in FIG. 3, the plurality of subpixel driving circuitries in the display panel include subpixel driving circuitries arranged in rows in the second direction and subpixel driving circuitries arranged in columns in the first direction. The initialization signal line patterns 904 corresponding to the subpixel driving circuitries in a same row are sequentially electrically coupled to form an integrated structure, the gate line patterns 902 corresponding to the subpixel driving circuitries in a same row are sequentially electrically coupled to form an integrated structure, the light-emission control signal line patterns 903 corresponding to the subpixel driving circuitries in a same row are sequentially electrically coupled to form an integrated structure, the resetting signal line patterns 905 corresponding to the subpixel driving circuitries in a same row are sequentially electrically coupled to form an integrated structure, the data line patterns 908 corresponding to the subpixel driving circuitries in a same column are sequentially electrically coupled to form an integrated structure, and the power source signal line patterns 901 corresponding to the subpixel driving circuitries in a same column are sequentially electrically coupled to form an integrated structure.

Illustratively, the subpixel driving circuitries in each row include a plurality of subpixels sequentially arranged in the direction X, and the initialization signal line pattern 904, the gate line pattern 902, the light-emission control signal line pattern 903 and the resetting signal line pattern 905 extend in the direction X. Each of the plurality of subpixel driving circuitries in each row is coupled to the corresponding initialization signal line pattern 904, the corresponding gate line pattern 902, the corresponding light-emission control signal line pattern 903 and the corresponding resetting signal line pattern 905. The subpixel driving circuitries in each column include a plurality of subpixels sequentially arranged in the direction Y, and the data line pattern 908 and the power source signal line pattern 901 extend in the direction Y. Each of the plurality of subpixel driving circuitries in each column is coupled to the corresponding data line pattern 908 and the corresponding power source signal line pattern 901.

Figure 1:
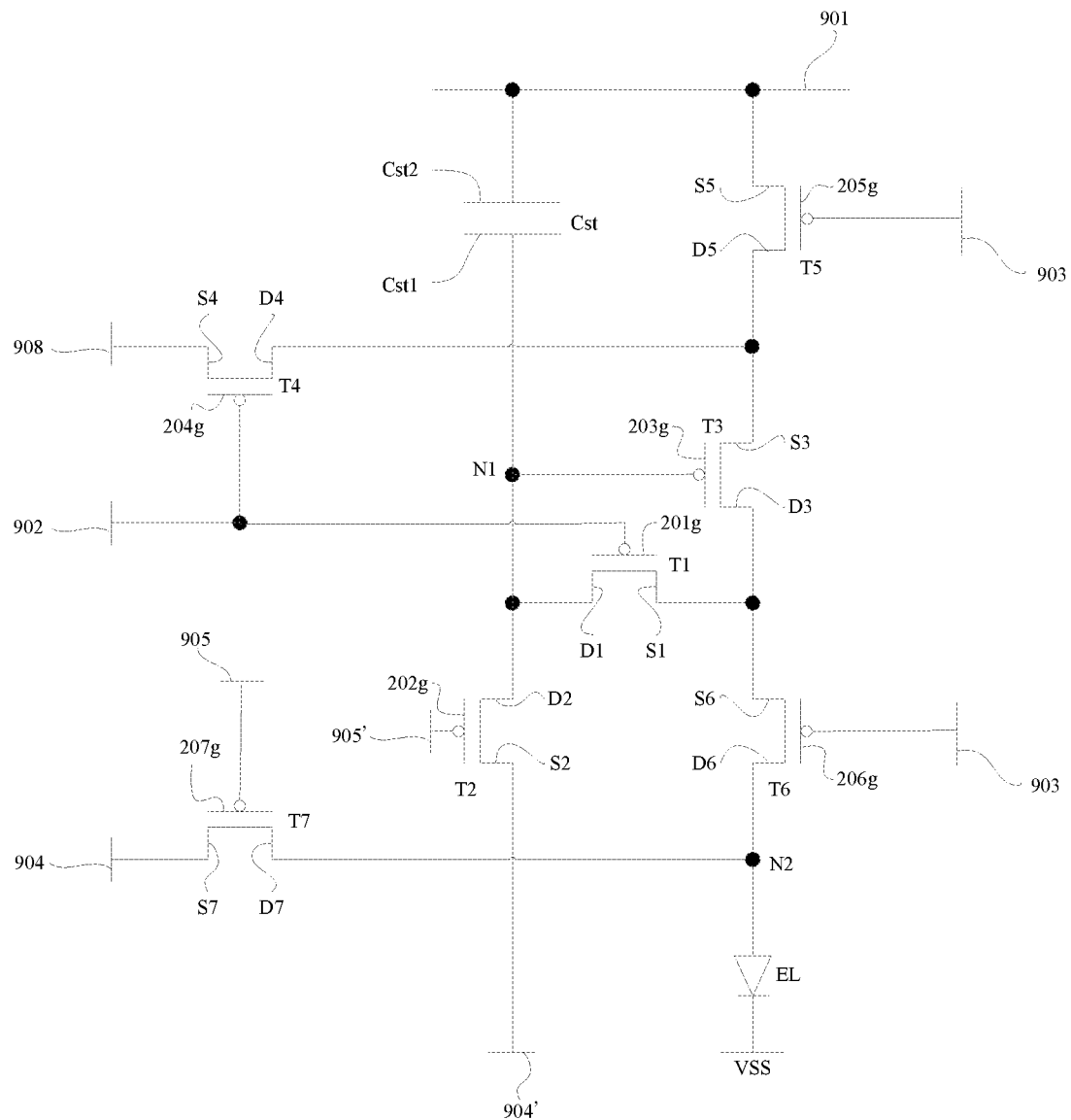
FIG. 1 is a circuit diagram of a subpixel driving circuitry according to one embodiment of the present disclosure.

As shown in FIGS. 1 and 3, taking one subpixel driving circuitry as an example, it includes seven thin film transistors and one capacitor. These transistors are all p-type transistors. A first transistor T1 is of a two-gate structure. A gate electrode 201g of the first transistor T1 is coupled to the gate line pattern 902, a source electrode S1 of the first transistor T1 is coupled to a drain electrode D3 of a third transistor T3 (i.e., a driving transistor), and a drain electrode D1 of the first transistor T1 is coupled to a gate electrode 203g of the third transistor T3.

A second transistor T2 is of a two-gate structure. A gate electrode 202g of the second transistor T2 is coupled to the resetting signal line pattern 905' in a next adjacent subpixel in the second direction, a source electrode S2 of the second transistor T2 is coupled to the initialization signal line pattern 904' in the next adjacent subpixel, and a drain electrode D2 of the second transistor T2 is coupled to the gate electrode 203g of the third transistor T3.

A gate electrode 204g of a fourth transistor T4 is coupled to the gate line pattern 902, a source electrode S4 of the fourth transistor T4 is coupled to the data line pattern 908, and a drain electrode D4 of the fourth transistor T4 is coupled to a source electrode S3 of the third transistor T3.

A gate electrode 205g of a fifth transistor T5 is coupled to the light-emission control signal line pattern 903, a source electrode S5 of the fifth transistor T5 is coupled to the power source signal line pattern 901, and a drain electrode T5 of the fifth transistor T5 is coupled to the source electrode S3 of the third driving transistor T3.

A gate electrode 206g of a sixth transistor T6 is coupled to the light-emission control signal line pattern 903, a source electrode S6 of the sixth transistor T6 is coupled to the drain electrode D3 of the third transistor T3, and a drain electrode D6 of the sixth transistor T6 is coupled to the anode pattern.

A gate electrode 207g of a seventh transistor T7 is coupled to the resetting signal line pattern 905, a drain electrode D7 of the seventh transistor T7 is coupled to the anode pattern, and a source electrode S7 of the seventh transistor T7 is coupled to the initialization signal line pattern 904.

A first electrode plate Cst1 of a storage capacitor Cst serves as the gate electrode 203g of the third transistor T3, and a second electrode plate Cst2 of the storage capacitor Cst is coupled to the power source signal line pattern 901.

Figure 2:
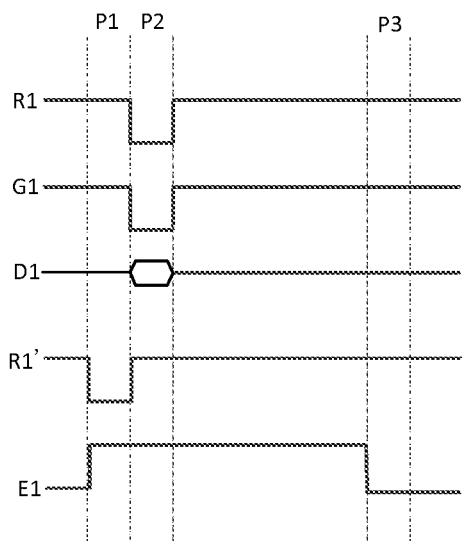
FIG. 2 is a sequence diagram of the subpixel driving circuitry according to one embodiment of the present disclosure.

As shown in FIGS. 1 and 2, during the operation of the subpixel driving circuitry with the above-mentioned structure, each operating period includes a resetting phase P1, a written-in compensation phase P2 and a light-emission phase P3. In FIG. 2, E1 represents a light-emission control signal transmitted on the light-emission control signal line pattern 903 of a current subpixel, R1 represents a resetting signal transmitted on the resetting signal line pattern 905 of the current subpixel, D1 represents a data signal transmitted on the data line pattern 908 of the current subpixel, G1 represents a gate scanning signal transmitted on the gate line pattern 902 of the current subpixel, and R1' represents a resetting signal transmitted on the resetting signal line pattern 905' of a next subpixel adjacent to the current subpixel in the second direction. During the operation of the display panel, the subpixel driving circuitries are scanned progressively from down to up.

At the resetting phase P1, the resetting signal inputted to the resetting signal line pattern 905' is at an active level, so as to turn on the second transistor T2. An initialization signal from the initialization signal line pattern 904' is inputted to the gate electrode 203g of the third transistor T3 via the second transistor T2, so as to clear a gate-to-source voltage Vgs maintained on the third transistor T3 within a previous frame, thereby to reset the gate electrode 203g of the third transistor T3.

At the written-in compensation phase P2, the resetting signal inputted to the resetting signal line pattern 905' is at an inactive level, so as to turn off the second transistor T2. The gate scanning signal inputted to the gate line pattern 902 is at an active level, so as to turn on the first transistor T1 and the fourth transistor T4. The data signal is written into the data line pattern 908, and flows to the source electrode S3 of the third transistor T3 via the fourth transistor T4. Meanwhile, the first transistor T1 and the fourth transistor T4 are turned on, so that the third transistor T3 forms a diode. Hence, through the cooperation of the first transistor T1, the third transistor T3 and the fourth transistor T4, it is able to compensate for a threshold voltage of the third transistor T3. In the case of a sufficiently long compensation time, a potential at the gate electrode 203g of the third transistor T3 finally reaches Vdata+Vth, where Vdata represents a voltage of the data signal, and Vth represents the threshold voltage of the third transistor T3.

At the written-in compensation phase P2, the resetting signal inputted to the resetting signal line pattern 905 is at an active level, so as to turn on the seventh transistor T7. The initialization signal from the initialization signal line pattern 904 is inputted to an anode a light-emitting element EL, so as to control the light-emitting element EL not to emit light.

At the light-emission phase P3, the light-emission control signal written into the light-emission signal line pattern 903 is at an active level, so as to turn on the fifth transistor T5 and the seventh transistor T6, thereby to enable a power source signal from the power source signal line pattern 901 to be inputted to the source electrode S3 of the third transistor T3. Meanwhile, the gate electrode 203g of the third transistor T3 is maintained at Vdata+Vth, so the third transistor T3 is turned on, and the gate-to-source voltage of the third transistor T3 is Vdata+Vth−VDD, where VDD represents a voltage of the power source signal. A leakage current generated on the basis of the gate-to-source voltage flows to the anode of the corresponding light-emitting element EL, so as to drive the light-emitting element EL to emit light.

As shown in FIGS. 4 to 7, during the manufacture of the subpixel driving circuitry, various film layers of the subpixel driving circuitry are arranged as follows. An active film layer, a gate insulation layer, a first gate metal layer, a first interlayer insulation layer, a second gate metal layer, a second interlayer insulation layer, a first source/drain metal layer and a third interlayer insulation layer are laminated one on another in a direction away from a substrate.

Figure 4:
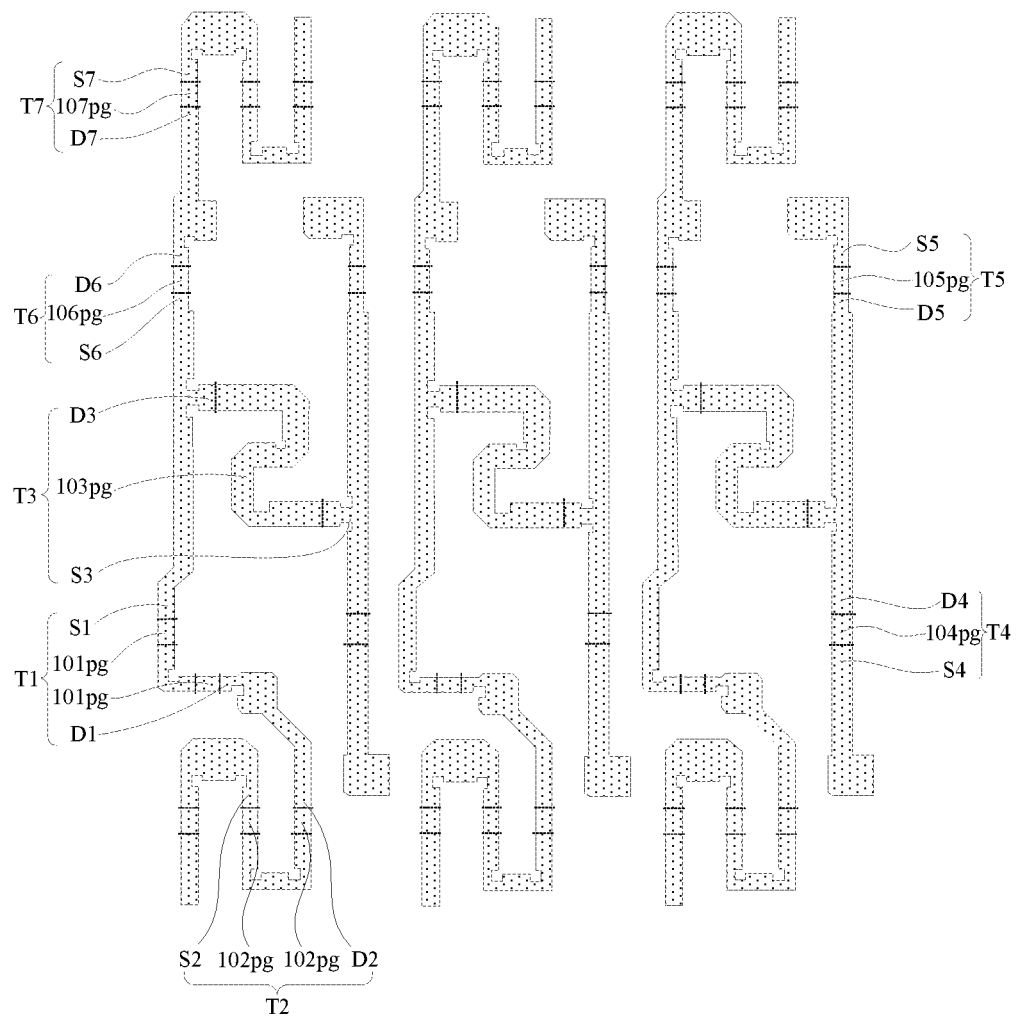
FIG. 4 is a schematic view showing the arrangement of an active layer in FIG. 3.

As shown in FIG. 4, the active film layer is used to form a channel region (e.g., 101pg to 107pg), a source electrode formation region and a drain electrode formation region of each transistor in the subpixel driving circuitry. Due to a doping effect, the active film layer at the source electrode formation region and the drain electrode formation region has conductivity better than the active film layer at the channel region. The active film layer may be made of amorphous silicon, polysilicon or an oxide semiconductor material. It should be appreciated that, the source electrode formation region and the drain electrode formation region may each be a region doped with an n-type impurity or a p-type impurity.

In addition, it should be appreciated that, the active film layer at the source electrode formation region or the drain electrode formation region may directly serve as the corresponding source electrode (e.g., S1 to S7) or the drain electrode (e.g., D1 to D7). Alternatively, the source electrode in contact with the source electrode formation region may be made of a metal material, and the drain electrode in contact with the drain electrode formation region may be made of a metal material.

Figure 5:
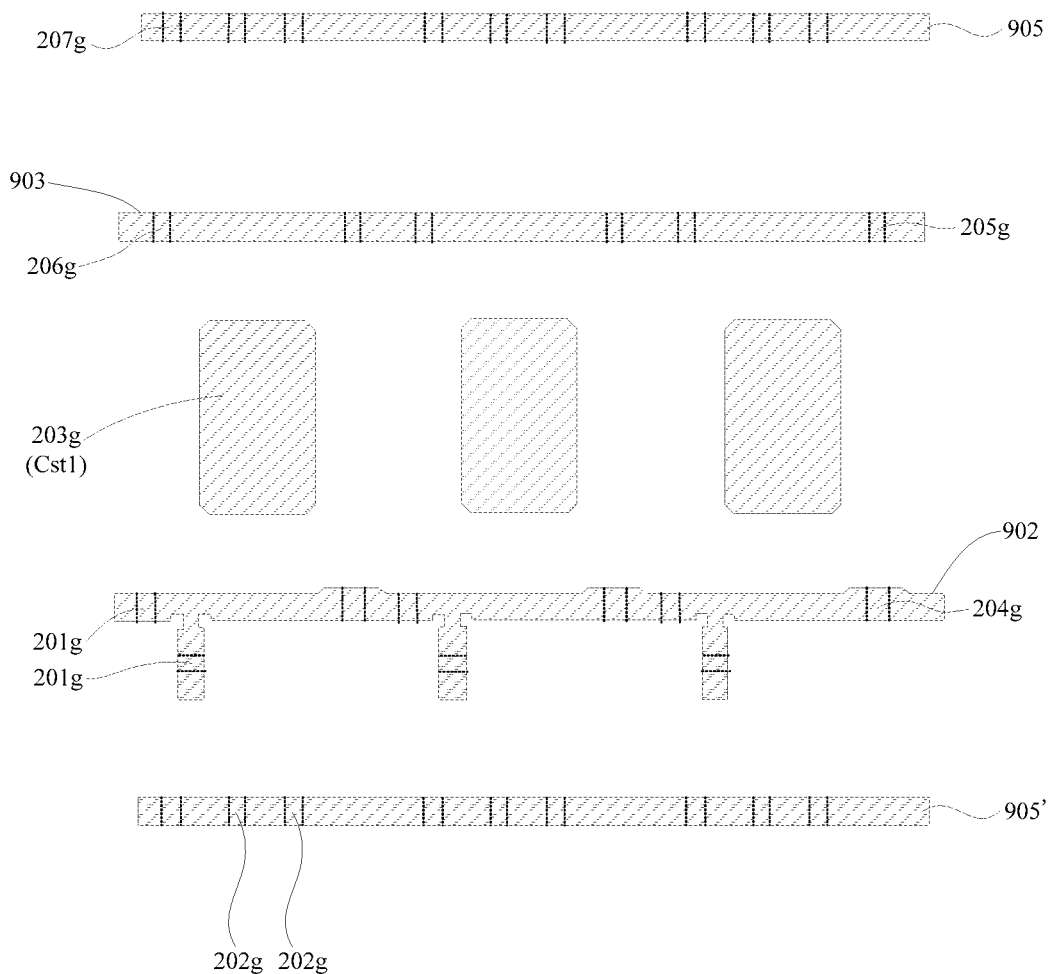
FIG. 5 is a schematic view showing the arrangement of a first gate metal layer in FIG. 3.

As shown in FIG. 5, the first gate metal layer is used to form the gate electrode (e.g., 201g to 207g) of each transistor in the subpixel driving circuitry as well as the gate line pattern 902, the light-emission control signal line pattern 903 and the resetting signal line pattern 905 of the display panel. The gate electrode 203g of the third transistor T3 in each subpixel driving circuitry serves as the first electrode plate Cst1 of the storage capacitor Cst.

Figure 6:
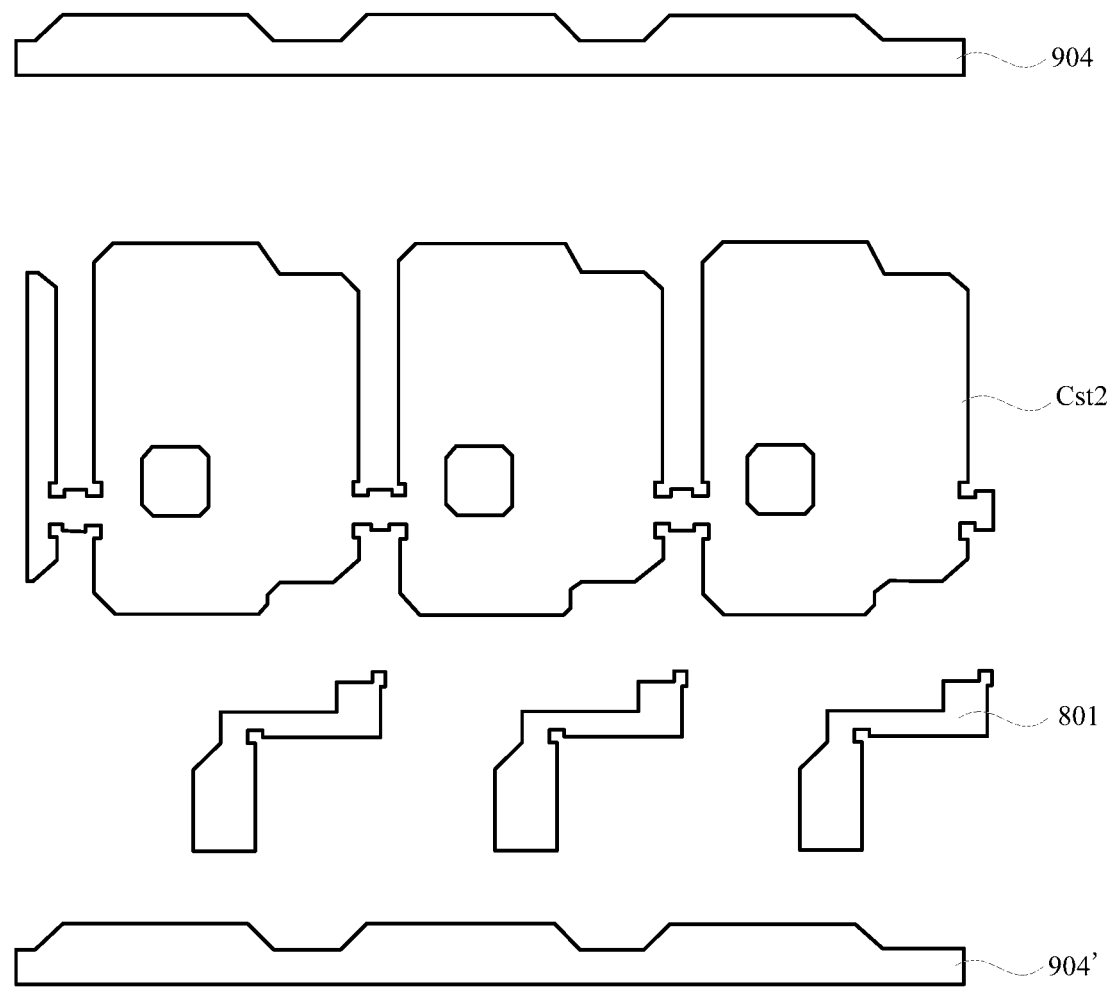
FIG. 6 is a schematic view showing the arrangement of a second gate metal layer in FIG. 3.

As shown in FIG. 6, the second gate metal layer is used to form the second electrode plate Cst2 of the storage capacitor Cst, a shielding pattern 801 for shielding, and the initialization signal line pattern 904 of the display panel.

Figure 7:
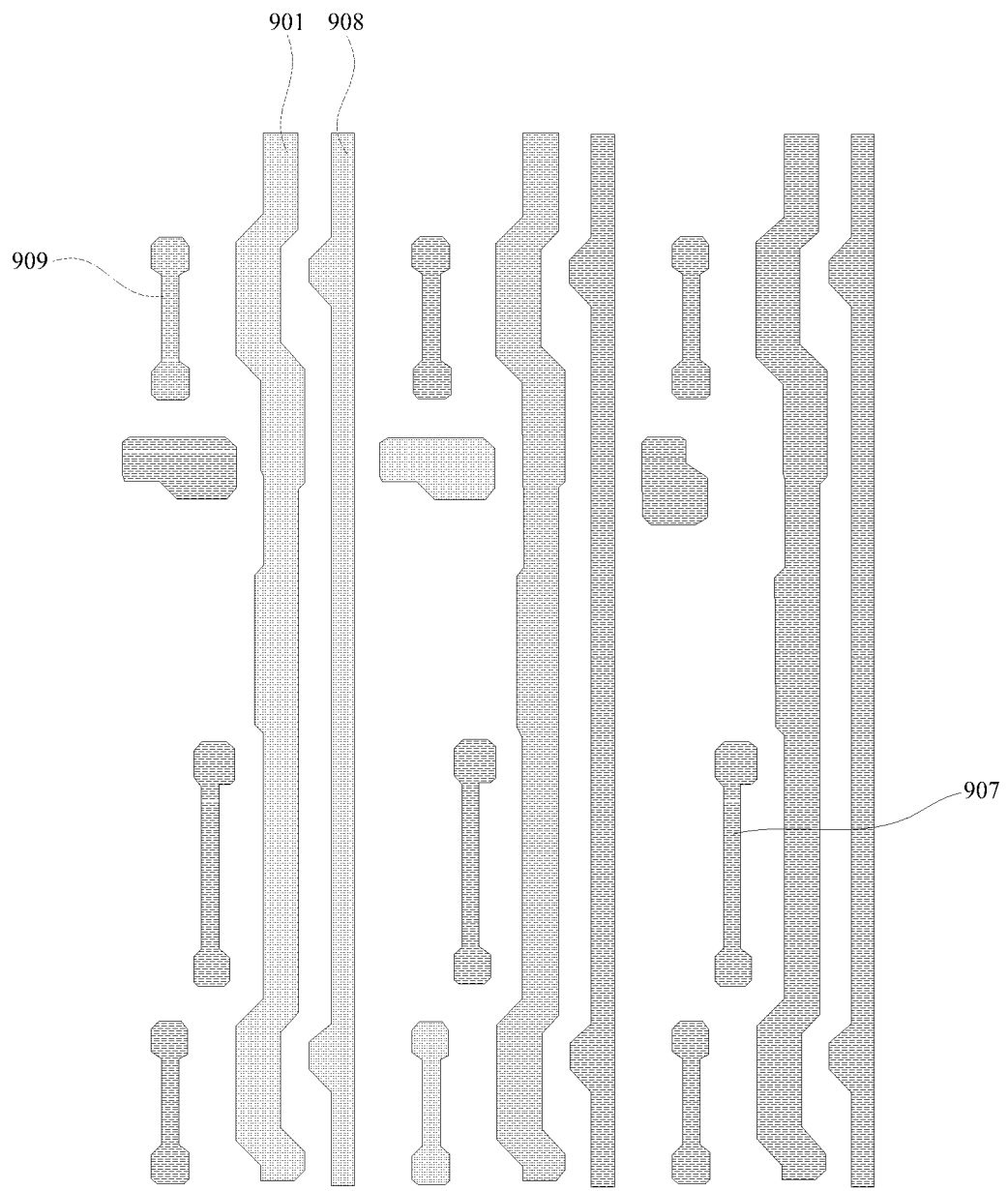
FIG. 7 is a schematic view showing the arrangement of a source/drain metal layer in FIG. 3.

As shown in FIG. 7, the first source/drain metal layer is used to form the data line pattern 908, the power source signal line pattern 901 and some conductive connection members of the display panel.

More detailed, referring to FIGS. 3 to 5 again, the gate electrode 201g of the first transistor T1 covers a first channel region 101pg, the gate electrode 202g of the second transistor T2 covers a second channel region 102pg, the gate electrode 203g of the third transistor T3 covers a third channel region 103pg, the gate electrode 204g of the fourth transistor T4 covers a fourth channel region 104pg, the gate electrode 205g of the fifth transistor T5 covers a fifth channel region 105pg, the gate electrode 206g of the sixth transistor T6 covers a sixth channel region 106pg, and the gate electrode 207g of the seventh transistor T7 covers a seventh channel region 107pg. The gate electrode 203g of the third transistor T3 serves as the first electrode plate Cst1 of the storage capacitor Cst, and the second electrode plate Cst2 of the storage capacitor Cst is coupled to the power source signal line pattern 901.

In addition, as shown in FIG. 3, for the display panel in the embodiments of the present disclosure, in the second direction (e.g., the direction Y), the gate electrode 204g of the fourth transistor T4, the gate electrode 201g of the first transistor T1 and the gate electrode 202g of the second transistor T2 are arranged at a first side of the gate electrode of the driving transistor (i.e., the gate electrode 203g of the third transistor T3), and the gate electrode 207g of the seventh transistor T7, the gate electrode 206g of the sixth transistor T6 and the gate electrode 205g of the fifth transistor T5 are arranged at a second side of the gate electrode of the driving transistor. Illustratively, the first side and the second side of the gate electrode of the driving transistor are arranged opposite to each other in the second direction. Further, the first side of the gate electrode of the driving transistor may be a lower side, and the second side of the gate electrode of the driving transistor may be an upper side. For example, a side of the display panel for bonding an integrated circuit (IC) is a lower side of the display panel, and the lower side of the gate electrode of the driving transistor is a side of the gate electrode of the driving transistor closer to the IC. The upper side is opposite to the lower side, e.g., a side of the gate electrode of the driving transistor further away from the IC.

In the first direction (e.g., the direction X), the gate electrode 204g of the fourth transistor T4 and the gate electrode 205g of the fifth transistor T5 are arranged at a third side of the gate electrode of the driving transistor, and the gate electrode 201g of the first transistor T1 and the gate electrode 206g of the sixth transistor T6 are arranged at a fourth side of the gate electrode of the driving transistor. Illustratively, the third side and the fourth side of the gate electrode of the driving transistor are arranged opposite to each other in the first direction. Further, the third side of the gate electrode of the driving transistor may be a right side, and the fourth side of the gate electrode of the driving transistor may be a left side. For example, in a same subpixel, the data line pattern 908 is arranged at a right side of the power source signal line pattern 901, and the power source signal line pattern 901 is arranged at a left side of the data line pattern 908.

Figure 9:
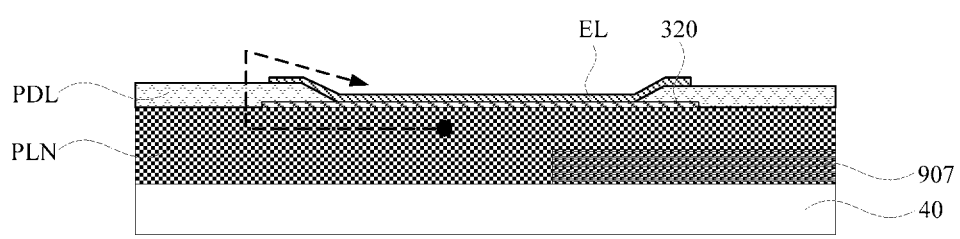
FIG. 9 is a sectional view of a subpixel along line A1A2 in FIG. 8.

According to the above-mentioned display panel, it is able to prevent, to some extent, a light-emitting functional layer from being eroded when molecules of water escape slowly from a planarization layer in use. As shown in FIGS. 8 and 9 (FIG. 9 is a sectional view of the subpixel along line A1A2 in FIG. 8), a black dot in FIG. 9 represents a molecule of water, and a dotted line with an arrow in FIG. 9 represents a diffusion path of the molecule of water. Although a channel for the diffusion of the molecule of water to the right is narrowed in a direction perpendicular to the substrate of the display panel, there is still a large diffusion channel to the left, so the molecule of water may still move along the left channel to seriously erode the light-emitting functional layer EL.

Hence, the pixel structure of the display panel needs to be further optimized, so as to prevent the light-emitting functional layer from being eroded when the molecules of water slowly escape from the planarization layer in use.

Figure 10:
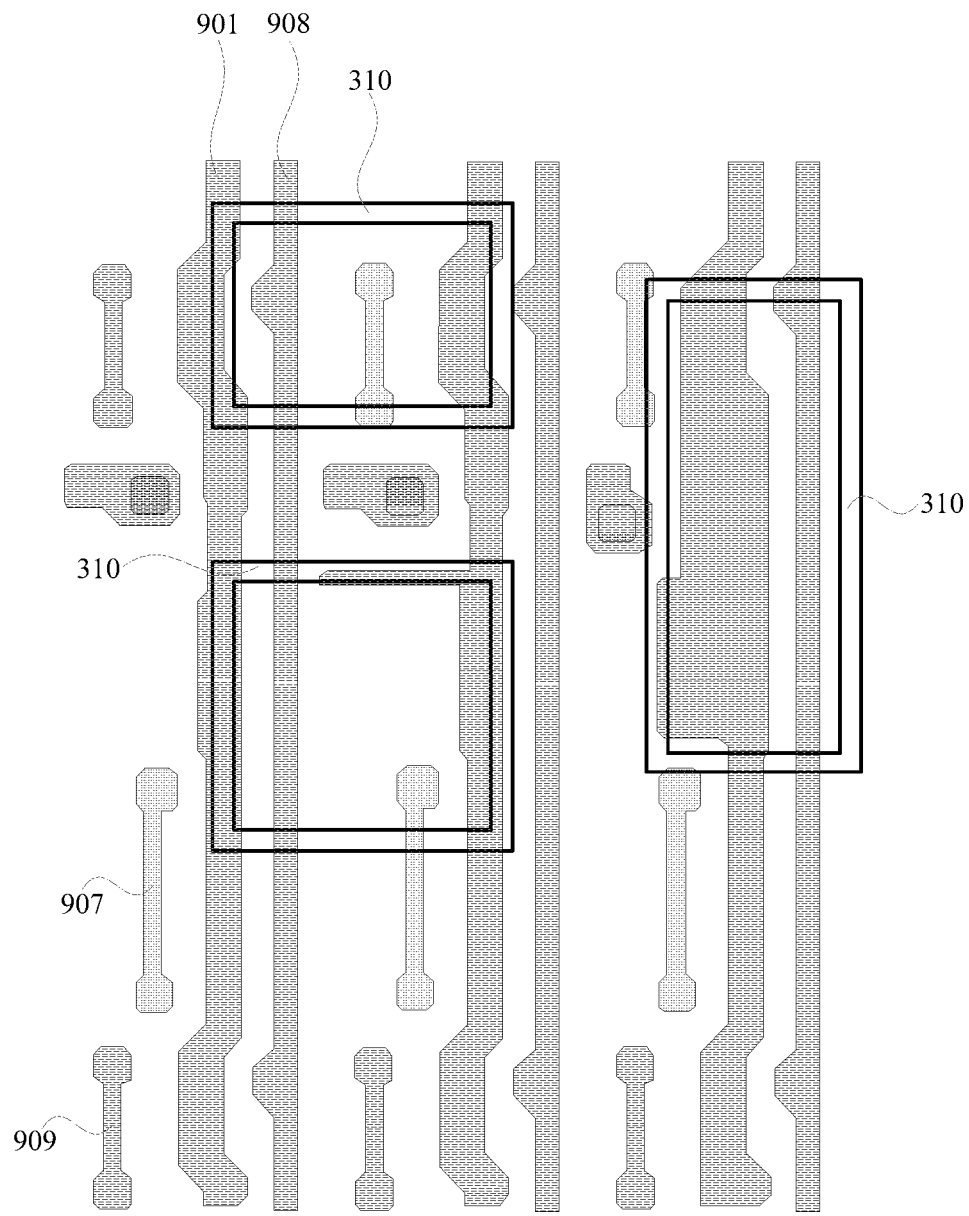
FIG. 10 is a schematic view showing the arrangement of the source/drain metal layer and a groove in a planarization layer according to one embodiment of the present disclosure.
Figure 13:
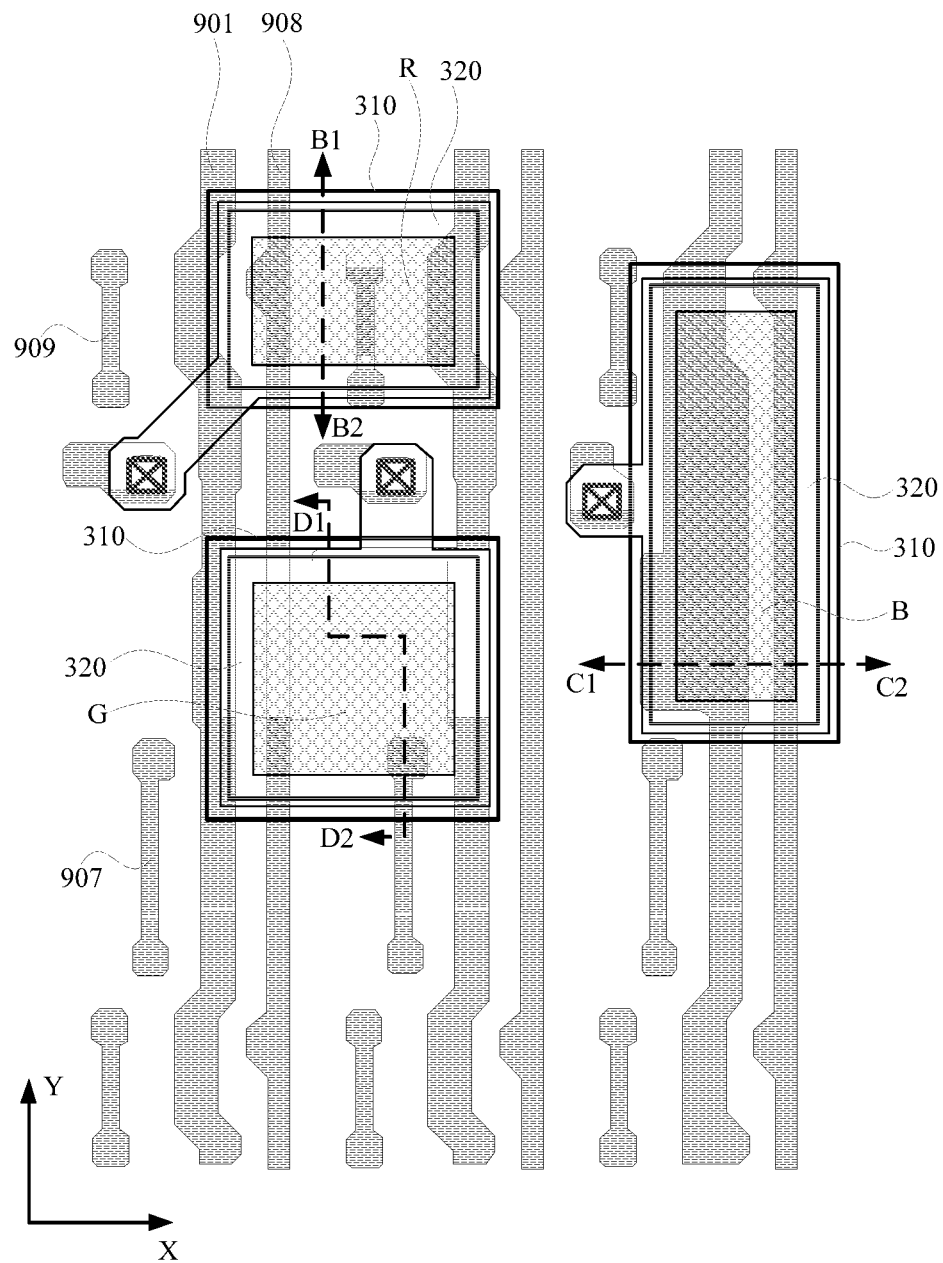
FIG. 13 is a schematic view showing the arrangement of the groove in the planarization layer and the anode pattern according to one embodiment of the present disclosure.
Figure 14:
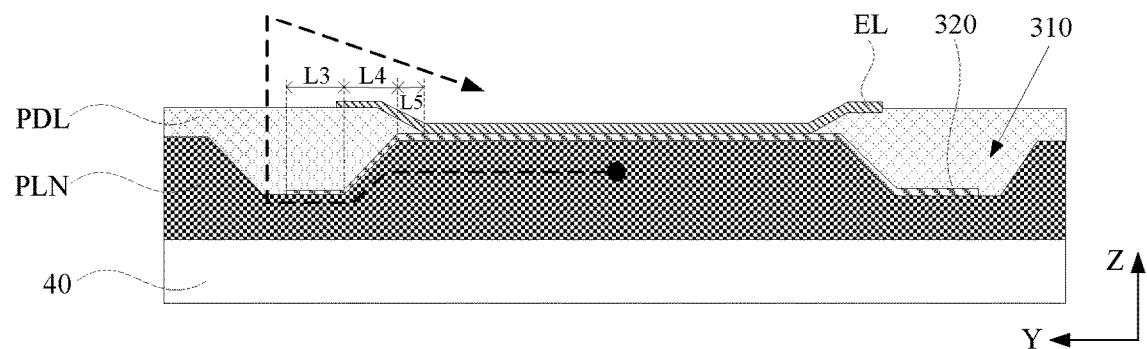
FIG. 14 is a sectional view of the subpixel along line B1B2 in FIG. 13.

As shown in FIGS. 10, 13 and 14, the present disclosure further provides in some embodiments a display panel, which includes a substrate, and a plurality of pixel units arranged on the substrate in an array form and each including a plurality of subpixels. Each subpixel includes a subpixel driving circuitry, a planarization layer PLN and an anode pattern 320 laminated one on another, each anode pattern 320 of at least a part of the subpixels includes a middle portion and a peripheral portion surrounding the middle portion, a groove 310 is formed in a surface of the planarization layer PLN away from the substrate, an orthogonal projection of the groove 310 onto the substrate surrounds an orthogonal projection of the middle portion onto the substrate, and at least a part of an orthogonal projection of the peripheral portion onto the substrate is located within the orthogonal projection of the groove 310 onto the substrate.

To be specific, the display panel includes the plurality of pixel units arranged in an array form, and each pixel unit includes a plurality of subpixels. Illustratively, each pixel unit includes one red subpixel R, one green subpixel G and one blue subpixel B, or each pixel unit includes one red subpixel R, two green subpixels G and one blue subpixel B.

Each subpixel includes the subpixel driving circuitry, the planarization layer PLN and the anode pattern 320 laminated one on another in a direction away from the substrate. In a possible embodiment of the present disclosure, the subpixel driving circuitry is, but not limited to, of a 7T1C structure (i.e., it includes seven thin film transistors and one storage capacitor). The subpixel driving circuitry is coupled to the anode pattern 320 in the subpixel where the subpixel driving circuitry is located, so as to provide a driving signal to the anode pattern 320.

Illustratively, each subpixel further includes a light-emitting functional layer EL arranged at a side of the anode pattern 320 away from the substrate, and a cathode layer. To be specific, the light-emitting functional layer EL includes a hole injection layer, a hole transport layer, an organic light-emitting material layer, an electron transport layer and an electron injection layer. In use, a negative power source signal is applied to the cathode layer, and the subpixel driving circuitry outputs the driving signal to the coupled anode pattern 320, so as to control the light-emitting material layer to emit light, thereby to achieve a display function of the display panel.

The planarization layer PLN is arranged between the subpixel driving circuitry and the anode pattern 320, and it functions so as to eliminate the level difference at a surface of the subpixel driving circuitry away from the substrate, and enable the anode pattern 320 thereon to be flatter, thereby to prevent the occurrence of color deviation for the display panel.

As shown in FIG. 14, the groove 310 is formed in the surface of the planarization layer PLN away from the substrate, and it has various structures. Illustratively, the orthogonal projection of the groove 310 onto the substrate has a closed structure or an unclosed structure. Illustratively, in the direction perpendicular to the substrate, a depth of the groove 310 is smaller than a minimum thickness of the planarization layer PLN, so as to enable the planarization layer PLN to fully cover a structure thereunder at the groove 310, thereby to prevent the occurrence of a short circuit between a structure on an upper surface of the planarization layer PLN (e.g., the anode pattern 320) and a structure on a lower surface of the planarization layer PLN (e.g., the source/drain metal layer) at the groove 310. Illustratively, the groove 310 penetrates through the planarization layer PLN, so as to expose a structure thereunder (e.g., an insulation film layer). At this time, it is necessary to ensure that no short circuit occurs between the structures above and under the planarization layer PLN at the groove 310.

It should be appreciated that, in FIG. 14, 40 represents the substrate and some film layers thereon.

The planarization layer PLN may be formed through a half-tone masking process, and at this time, the formed planarization layer PLN may include a via-hole penetrating through the planarization layer PLN. The anode pattern 320 is coupled to the subpixel driving circuitry through the via-hole. The planarization layer PLN may further include the groove 310, and in the direction perpendicular to the substrate, the depth of the groove 310 is smaller than the minimum thickness of the planarization layer PLN.

Each anode pattern 320 of at least a part of the subpixels may include the middle portion and the peripheral portion surrounding the middle portion. The middle portion and the peripheral portion are formed as one piece. The orthogonal projection of the groove 310 onto the substrate surrounds the orthogonal projection of the middle portion onto the substrate, and the orthogonal projection of at least a part of the peripheral portion onto the substrate is located within the orthogonal projection of the groove 310 onto the substrate.

In FIG. 14, L3 represents a width of a portion of the anode pattern 320 reaching a groove bottom of the groove 310 in the direction Y, L4 represents a width of a portion of the planarization layer PLN at a film-layer thickness transition region at a groove wall of the groove 310 in the direction Y, and L5 represents a width of a boundary of a pixel definition layer PDL extends beyond the film-layer thickness transition region at a pixel opening in the direction Y. In order to prevent a structural design from being adversely affected by an alignment offset during the formation of different film layers, each of L3 and L4 needs to be greater than 2 μm. It should be appreciated that, in FIG. 14, a direction Z is perpendicular to the substrate.

Based on the above-mentioned structure of the display panel, through the groove 310 in the surface of the planarization layer PLN away from the substrate, it is able to provide the planarization layer PLN with a structure having a convex middle portion. Meanwhile, when the orthogonal projection of the groove 310 onto the substrate surrounds the orthogonal projection of the middle portion onto the substrate and the orthogonal projection of at least a part of the peripheral portion onto the substrate is located within the orthogonal projection of the groove 310 onto the substrate, it is able for the anode pattern 320 to cover a part of the planarization layer PLN surrounded by the groove 310 and at least a part of the planarization layer PLN in the groove 310, as shown in FIG. 14. Through the above-mentioned arrangement, it is able to narrow the diffusion channel of the molecule of water inside the planarization layer PLN (e.g., in FIG. 14, a thickness of a portion of the planarization layer PLN at the groove bottom of the groove 310 is reduced relative to a thickness of the other portion of the planarization layer PLN), and prolong a diffusion path of the molecule of water toward the light-emitting functional layer EL (in FIG. 14, a dotted line with an arrow indicates the diffusion path). Hence, according to the display panel in the embodiments of the present disclosure, through narrowing the channel for the diffusion of the molecule of water in the planarization layer PLN and prolonging the diffusion path of the molecule of water in the planarization layer PLN, it is able to effectively reduce a release speed of the molecule of water in the planarization layer PLN and slow down the erosion of the molecule of water on the light-emitting functional layer EL, thereby to prolong the service life of the display panel.

In addition, according to the display panel in the embodiments of the present disclosure, through the groove 310 in the surface of the planarization layer PLN away from the substrate, a thickness of the planarization layer PLN in the direction perpendicular to the substrate at the groove 310, and thereby a volume of the planarization layer PLN at the groove 310, may be reduced. As a result, it is able to reduce a total amount of residual water in the planarization layer PLN, and reduce the erosion of the molecule of water on the light-emitting functional layer EL, thereby to prolong the service life of the display panel.

In some embodiments of the present disclosure, the groove 310 includes a groove bottom and a groove wall, and the orthogonal projection of the peripheral portion onto the substrate overlaps an orthogonal projection of the groove bottom of the groove 310 onto the substrate.

To be specific, an overlapping area between the anode pattern 320 and the groove 310 may be set according to the practical need. Illustratively, the orthogonal projection of the peripheral portion of the anode pattern 320 onto the substrate overlaps an orthogonal projection of the groove wall of the groove 310 onto the substrate.

Illustratively, the orthogonal projection of the peripheral portion of the anode pattern 320 onto the substrate overlaps the orthogonal projection of the groove bottom of the groove 310 onto the substrate.

Illustratively, the orthogonal projection of the peripheral portion of the anode pattern 320 onto the substrate fully covers the orthogonal projection of the groove bottom of the groove 310 onto the substrate.

When the orthogonal projection of the peripheral portion onto the substrate overlaps the orthogonal projection of the groove bottom of the groove 310 onto the substrate, it is able for the anode pattern 320 to cover at least a part of the planarization layer PLN at the groove bottom of the groove 310, as shown in FIG. 14. Through this arrangement, it is able to not only narrow the diffusion channel of the molecule of water in the planarization layer PLN (e.g., in FIG. 14, a thickness of a part of the planarization layer PLN at the groove bottom of the groove 310 is reduced relative to a thickness of the other part of the planarization layer PLN), but also prolong the diffusion path of the molecule of water toward the light-emitting functional layer EL (in FIG. 14, a dotted line with an arrow indicates the diffusion path). Hence, according to the display panel in the embodiments of the present disclosure, through narrowing the channel for the diffusion of the molecule of water in the planarization layer PLN and prolonging the diffusion path of the molecule of water in the planarization layer PLN, it is able to effectively reduce a release speed of the molecule of water in the planarization layer PLN and slow down the erosion of the molecule of water on the light-emitting functional layer EL, thereby to prolong the service life of the display panel.

As shown in FIGS. 11, 13, 15 and 16, in some embodiments of the present disclosure, each subpixel further includes a compensation pattern 906 arranged at a side of the planarization layer PLN facing the substrate, and an orthogonal projection of the compensation pattern 906 onto the substrate overlaps at least a part of the orthogonal projection of the groove 310 in the planarization layer PLN onto the substrate.

Illustratively, the orthogonal projection of the compensation pattern 906 onto the substrate overlaps at least a part of the orthogonal projection of the groove bottom of the groove 310 in the planarization layer PLN onto the substrate.

Illustratively, the compensation pattern 906 is arranged between the substrate and at least a part of the planarization layer PLN, and in contact with the surface of the planarization layer PLN facing the substrate.

Illustratively, the compensation pattern 906 is made of the source/drain metal layer in the display panel, i.e., it is arranged at a same layer, and made of a same material, as the power source signal line pattern 901 and the data line pattern 908. In this way, it is able to form the compensation pattern 906, the power source signal line pattern 901 and the data line pattern 908 through a single patterning process.

The planarization layer PLN is used to eliminate the level difference for the structure covered thereby, so in the direction perpendicular to the substrate, the planarization layer PLN has an uneven thickness. In addition, a part of the planarization layer PLN covering a first structure has a smaller thickness, and a part of the planarization layer PLN covering a second structure has a larger thickness. In the direction perpendicular to the substrate, a surface of the first structure away from the substrate is located at a level higher than a surface of the second structure away from the substrate.

Figure 15:
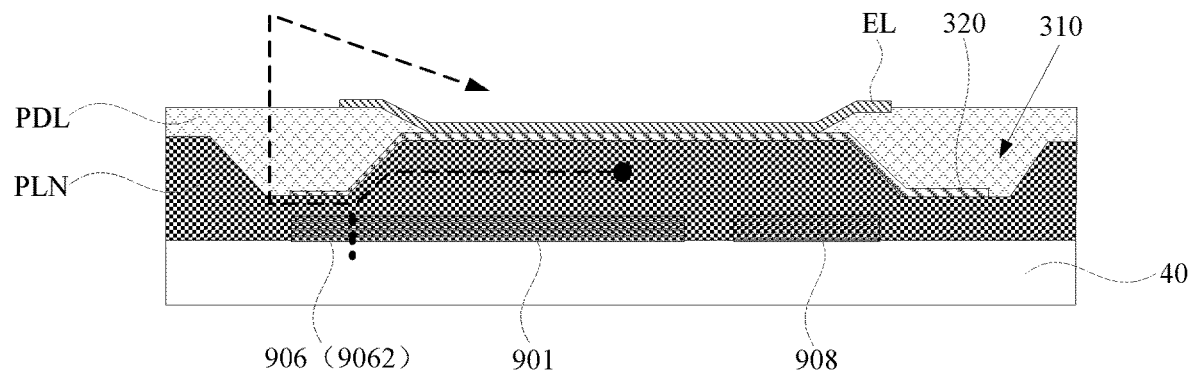
FIG. 15 is a sectional view of the subpixel along line C1C2 in FIG. 13.
Figure 16:
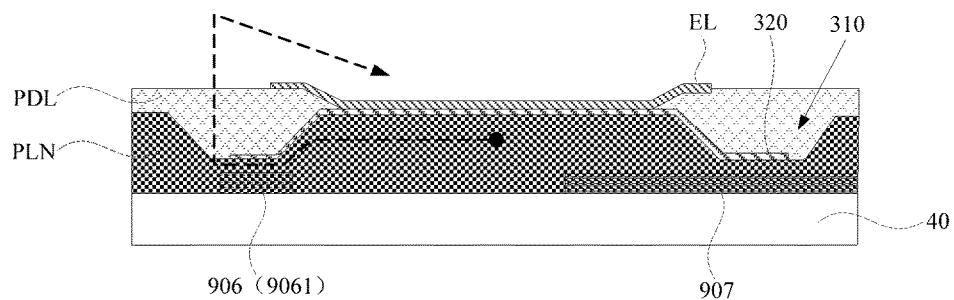
FIG. 16 is a sectional view of the subpixel along line D1D2 in FIG. 13.

When the orthogonal projection of the compensation pattern 906 overlaps at least a part of the orthogonal projection of the groove 310 in the planarization layer PLN onto the substrate, it is able to further reduce the thickness of the planarization layer PLN in the direction perpendicular to the substrate at the groove 310, thereby to further narrow the diffusion channel of the molecule of water in the planarization layer PLN (e.g., in FIGS. 15 and 16, a thickness of a part of the planarization layer PLN at the groove bottom of the groove 310 is further reduced). Hence, according to the display panel in the embodiments of the present disclosure, through further narrowing the channel for the diffusion of the molecule of water in the planarization layer PLN, it is able to effectively reduce a release speed of the molecule of water in the planarization layer PLN and slow down the erosion of the molecule of water on the light-emitting functional layer EL in a better manner, thereby to prolong the service life of the display panel.

In addition, when the orthogonal projection of the compensation pattern 906 onto the substrate overlaps at least a part of the orthogonal projection of the groove 310 in the planarization layer PLN onto the substrate, the thickness of the planarization layer PLN in the direction perpendicular to the substrate at the groove 310, and thereby the volume of the planarization layer PLN at the groove 310, may be further reduced. As a result, it is able to reduce a total amount of residual water in the planarization layer PLN, and reduce the erosion of the molecule of water on the light-emitting functional layer EL in a better manner, thereby to prolong the service life of the display panel.

As shown in FIG. 15, in some embodiments of the present disclosure, the orthogonal projection of the compensation pattern 906 onto the substrate overlaps the orthogonal projection of the middle portion of the anode pattern 320 onto the substrate.

When the orthogonal projection of the compensation pattern 906 onto the substrate overlaps the orthogonal projection of the middle portion of the anode pattern 320 onto the substrate, the thickness of the planarization layer PLN in the direction perpendicular to the substrate at a region covered by the middle portion, and thereby the volume of the planarization layer PLN at the region covered by the middle portion, may be further reduced. As a result, it is able to reduce a total amount of residual water in the planarization layer PLN, and reduce the erosion of the molecule of water on the light-emitting functional layer EL in a better manner, thereby to prolong the service life of the display panel.

Figure 11:
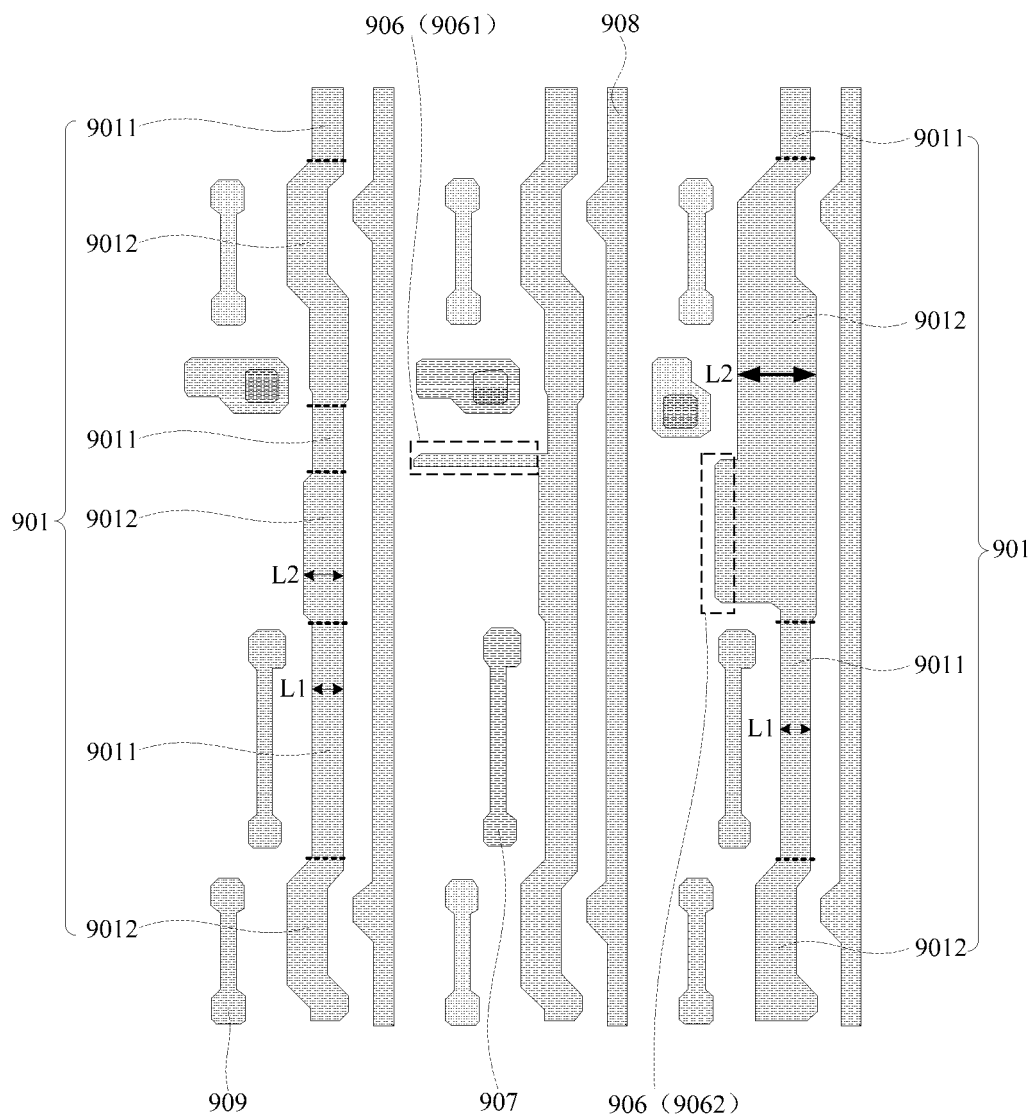
FIG. 11 is a schematic view showing the single-layer arrangement of the source/drain metal layer in FIG. 10.
Figure 12:
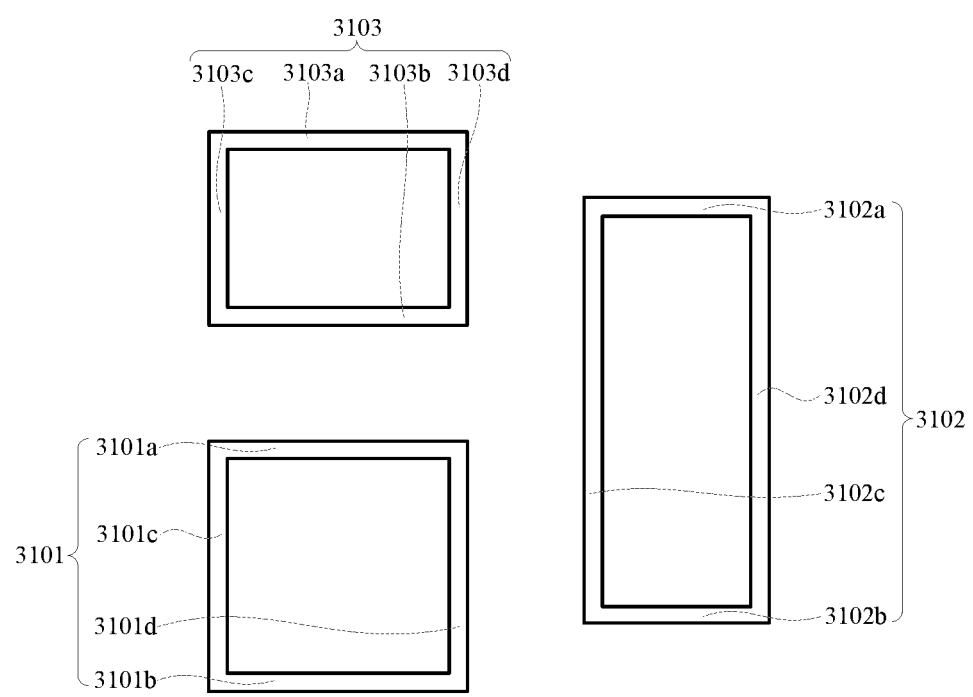
FIG. 12 is a schematic view showing the arrangement of the groove in the planarization layer in FIG. 10.

As shown in FIGS. 12, 13 and 15, in some embodiments of the present disclosure, each pixel unit includes one red subpixel R, one blue subpixel B and one green subpixel G. The red subpixel R and the green subpixel G are arranged in a same column in a second direction, and the blue subpixel B is arranged in another column. The green subpixel G includes: a first power source signal line pattern, at least a part of the first power source signal line pattern extending in the second direction; a first compensation pattern 9061 coupled to the first power source signal line pattern and extending in a first direction, the first direction crossing the second direction; and a first planarization layer (as shown in FIGS. 10 to 12), a first groove 3101 of a rectangular shape being formed in the first planarization layer, the first groove 3101 including a first portion 3101a and a second portion 3101b arranged opposite to each other in the second direction and a third portion 3101c and a fourth portion 3101d arranged opposite to each other in the first direction, an orthogonal projection of the first portion 3101a onto the substrate overlapping an orthogonal projection of the first compensation pattern 9061 onto the substrate.

To be specific, FIG. 13 shows the arrangement of the source/drain metal layer, the groove 310 in the planarization layer PLN and the anode pattern 310 in three subpixels (RGB) of one pixel unit.

Illustratively, as shown in FIG. 11, the first power source signal line pattern and the first compensation pattern 9061 form an integrated structure. Through this arrangement, it is able to not only provide the first compensation pattern 9061 with a same stable potential as the first power source signal line pattern 901, but also form the first compensation pattern 9061 and the first power source signal line pattern through a single patterning process.

Illustratively, the first groove 3101 of a rectangular shape is formed in the first planarization layer, and it includes the first portion 3101a and the second portion 3101b arranged opposite to each other in the second direction and the third portion 3101c and the fourth portion 3101d arranged opposite to each other in the first direction. The first portion 3101a and the second portion 3101b extend in the first direction, and the third portion 3101c and the fourth portion 3101d extend in the second direction.

When the orthogonal projection of the first portion 3101a onto the substrate overlaps the orthogonal projection of the first compensation pattern 9061 onto the substrate, it is able to further reduce the thickness of the first planarization layer in the direction perpendicular to the substrate at a position where the first portion 3101a of the first groove 3101 is located, thereby to further narrow the diffusion channel of the molecule of water in the first planarization layer (e.g., in FIG. 15, the thickness of the first planarization layer at a bottom of the first groove 3101 is further reduced). Hence, according to the display panel in the embodiments of the present disclosure, through further narrowing the channel for the diffusion of the molecule of water in the first planarization layer, it is able to effectively reduce a release speed of the molecule of water in the first planarization layer and slow down the erosion of the molecule of water on the light-emitting functional layer EL in a better manner, thereby to prolong the service life of the display panel.

In addition, when the orthogonal projection of the first portion 3101a onto the substrate overlaps the orthogonal projection of the first compensation pattern 9061 onto the substrate, the thickness of the first planarization layer in the direction perpendicular to the substrate at the position where the first portion 3101a of the first groove 3101 is located, and thereby the volume of the first planarization layer at the first groove 3101, may be further reduced. As a result, it is able to reduce a total amount of residual water in the first planarization layer, and reduce the erosion of the molecule of water on the light-emitting functional layer EL in a better manner, thereby to prolong the service life of the display panel.

As shown in FIGS. 11, 12, 13 and 16, in some embodiments of the present disclosure, each pixel unit includes one red subpixel R, one blue subpixel B and one green subpixel G. The red subpixel R and the green subpixel G are arranged in a same column in a second direction, and the blue subpixel B is arranged in another column. The blue subpixel B includes: a second power source signal line pattern, at least a part of the second power source signal line pattern extending in the second direction; a second compensation pattern 9062 (as shown in FIG. 11) coupled to the second power source signal line pattern, protruding from the second power source signal line pattern in a first direction, and extending in the second direction; and a second planarization layer (as shown in FIG. 12), a second groove 3102 of a rectangular shape being formed in the second planarization layer, the second groove 3102 including a fifth portion 3102a and a sixth portion 3102b arranged opposite to each other in the second direction and a seventh portion 3102c and an eighth portion 3102d arranged opposite to each other in the first direction, an orthogonal projection of the seventh portion 3102c onto the substrate overlapping an orthogonal projection of the second compensation pattern 9062 onto the substrate.

Illustratively, the second power source signal line pattern and the second compensation pattern 9062 form an integrated structure. Through this arrangement, it is able to not only provide the second compensation pattern 9062 with a same stable potential as the second power source signal line pattern, but also form the second compensation pattern 9062 and the second power source signal line pattern through a single patterning process.

Illustratively, the second groove 3102 of a rectangular shape is formed in the second planarization layer, and it includes the fifth portion 3102a and the sixth portion 3102b arranged opposite to each other in the second direction and the seventh portion 3102c and the eighth portion 3102d arranged opposite to each other in the first direction. The fifth portion 3102a and the sixth portion 3102b extend in the first direction, and the seventh portion 3102c and the eighth portion 3102d extend in the second direction.

When the orthogonal projection of the seventh portion 3102a onto the substrate overlaps the orthogonal projection of the second compensation pattern 9062 onto the substrate, it is able to further reduce the thickness of the second planarization layer in the direction perpendicular to the substrate at a position where the seventh portion 3102c of the second groove 3102 is located, thereby to further narrow the diffusion channel of the molecule of water in the second planarization layer (e.g., in FIG. 16, the thickness of the second planarization layer at a bottom of the second groove 3102 is further reduced). Hence, according to the display panel in the embodiments of the present disclosure, through further narrowing the channel for the diffusion of the molecule of water in the second planarization layer, it is able to effectively reduce a release speed of the molecule of water in the second planarization layer and slow down the erosion of the molecule of water on the light-emitting functional layer EL in a better manner, thereby to prolong the service life of the display panel.

In addition, when the orthogonal projection of the seventh portion 3102c onto the substrate overlaps the orthogonal projection of the second compensation pattern 9062 onto the substrate, the thickness of the second planarization layer in the direction perpendicular to the substrate at the position where the seventh portion 3102c of the second groove 3102 is located, and thereby the volume of the second planarization layer at the second groove 3102, may be further reduced. As a result, it is able to reduce a total amount of residual water in the first planarization layer, and reduce the erosion of the molecule of water on the light-emitting functional layer EL in a better manner, thereby to prolong the service life of the display panel.

As shown in FIG. 12, the red subpixel R includes a third planarization layer, and a third groove 3103 of a rectangular shape is formed in the third planarization layer. The third groove 3103 includes a ninth portion 3103a and a tenth portion 3103b arranged opposite to each other in the second direction, and an eleventh portion 3103c and a twelfth portion 3103d arranged opposite to each other in the first direction.

It should be appreciated that, according to the display panel in the embodiments of the present disclosure, the planarization layers PLN in the subpixels are formed as an integrated structure. Through the integrated planarization layer PLN, it is able to effectively eliminate the level difference at the surface of each subpixel driving circuitry away from the substrate.

As shown in FIGS. 11 and 13, in some embodiments of the present disclosure, each subpixel includes a power source signal line pattern 901, and at least a part of the power source signal line pattern 901 extends in a second direction. The power source signal line pattern 901 includes a first power source member 9012 and a second power source member 9011. A width L2 of the first power source member 9012 is greater than a width L1 of the second power source member 9011 in a direction perpendicular to the second direction, and an orthogonal projection of the first power source member 9012 onto the substrate overlaps the orthogonal projection of the middle portion of the anode pattern 320 onto the substrate.

To be specific, the power source signal line pattern 901 includes the first power source member 9012 and the second power source member 9011. Illustratively, the first power source members 9012 and the second power source members 9011 are arranged alternately in the second direction, and each first power source member is coupled to an adjacent second power source member. Illustratively, the first power source member 9012 and the second power source member 9011 are formed integrally.

Illustratively, in a direction perpendicular to the second direction, a minimum width of the first power source member 9012 is greater than a maximum width of the second power source member 9011.

When the orthogonal projection of the first power source member 9012 onto the substrate overlaps the orthogonal projection of the middle portion of the anode pattern 320 onto the substrate, the thickness of the planarization layer PLN in the direction perpendicular to the substrate at a region covered by the middle portion of the anode pattern 320, and thereby the volume of the planarization layer PLN, may be reduced effectively. As a result, it is able to reduce a total amount of residual water in the planarization layer PLN, and reduce the erosion of the molecule of water on the light-emitting functional layer EL in a better manner, thereby to prolong the service life of the display panel.

As shown in FIG. 13, in some embodiments of the present disclosure, each subpixel further includes: a power source signal line pattern 901, at least a part of the power source signal line pattern extending in a second direction; and a data line pattern 908, at least a part of the data line pattern extending in the second direction. The subpixel driving circuitry includes a driving transistor, and in one subpixel, an orthogonal projection of the power source signal line pattern 901 onto the substrate is located between an orthogonal projection of an output electrode of the driving transistor onto the substrate and an orthogonal projection of the data line pattern 908 onto the substrate. The orthogonal projection of the power source signal line pattern 901 onto the substrate overlaps the orthogonal projection of the groove 310 in the planarization layer PLN onto the substrate, and/or overlaps the orthogonal projection of the middle portion of the anode pattern 320 onto the substrate. The orthogonal projection of the data line pattern 908 onto the substrate overlaps the orthogonal projection of the groove 310 in the planarization layer PLN onto the substrate, and/or overlaps the orthogonal projection of the middle portion of the anode pattern 320 onto the substrate.

To be specific, the driving transistor includes a gate electrode, a first electrode and a second electrode. The first electrode of the driving transistor serves as an input electrode of the driving transistor, and the second electrode serves as the output electrode. The input electrode of the driving transistor receives a power source signal from the power source signal line pattern 901.

The power source signal line pattern 901, the data line pattern 908 and the driving transistor may be arranged in various modes. Illustratively, in one subpixel, the orthogonal projection of the power source signal line pattern 901 onto the substrate is located between the orthogonal projection of the output electrode of the driving transistor onto the substrate and the orthogonal projection of the data line pattern 908 onto the substrate, or in one subpixel, the orthogonal projection of the data line pattern 908 onto the substrate is located between the orthogonal projection of the output electrode of the driving transistor onto the substrate and the orthogonal projection of the power source signal line pattern 901 onto the substrate.

When the orthogonal projection of the power source signal line pattern 901 onto the substrate overlaps the orthogonal projection of the groove 310 in the planarization layer PLN onto the substrate and/or the orthogonal projection of the middle portion of the anode pattern 320 onto the substrate, and the orthogonal projection of the data line pattern 908 onto the substrate overlaps the orthogonal projection of the groove 310 in the planarization layer PLN onto the substrate and/or the orthogonal projection of the middle portion of the anode pattern 320 onto the substrate, it is able to further reduce the thickness of the planarization layer PLN in the direction perpendicular to the substrate at the groove 310, thereby to further narrow the diffusion channel of the molecule of water in the planarization layer PLN. As a result, it is able to effectively reduce a release speed of the molecule of water in the planarization layer PLN and slow down the erosion of the molecule of water on the light-emitting functional layer EL in a better manner, thereby to prolong the service life of the display panel.

In addition, through the above arrangement, it is able to further reduce the volume of the planarization layer PLN at the groove 310, reduce a total amount of residual water in the planarization layer PLN, and reduce the erosion of the molecule of water on the light-emitting functional layer EL in a better manner, thereby to prolong the service life of the display panel.

In addition, through the above arrangement, it is able to effectively reduce the thickness of the planarization layer PLN in the direction perpendicular to the substrate at a region covered by the middle portion of the anode pattern 320, reduce the volume of the planarization layer PLN, reduce a total amount of residual water in the planarization layer PLN, and reduce the erosion of the molecule of water on the light-emitting functional layer EL in a better manner, thereby to prolong the service life of the display panel.

As shown in FIG. 13, in some embodiments of the present disclosure, each subpixel further includes a first conductive connection member 907, and at least a part of the first conductive connection member 907 extends in a second direction. The subpixel driving circuitry includes a driving transistor and a first transistor, a first electrode of the first transistor is coupled to a second electrode of the driving transistor, and a second electrode of the first transistor is coupled to a gate electrode of the driving transistor through the first conductive connection member 907. An orthogonal projection of the first conductive connection member 907 onto the substrate overlaps the orthogonal projection of the groove 310 in the planarization layer PLN onto the substrate, and/or overlaps the orthogonal projection of the middle portion of the anode pattern 320 onto the substrate.

To be specific, each subpixel driving circuitry includes the driving transistor and the first transistor. The first transistor is coupled between the second electrode of the driving transistor and the gate electrode of the driving transistor, so as to compensate for a threshold voltage of the driving transistor at a compensation phase.

When the orthogonal projection of the first conductive connection member 907 onto the substrate overlaps the orthogonal projection of the groove 310 in the planarization layer PLN onto the substrate and/or overlaps the orthogonal projection of the middle portion of the anode pattern 320 onto the substrate, the thickness of the planarization layer PLN in the direction perpendicular to the substrate may be reduced at the groove 310. As a result, it is able to further narrow the diffusion channel of the molecular of water in the planarization layer PLN, reduce a release speed of the molecule of water in the planarization layer PLN in a better manner, and slow down the erosion of the molecule of water on the light-emitting functional layer EL, thereby to prolong the service life of the display panel.

In addition, through the above-mentioned arrangement, it is able to further reduce the volume of the planarization layer PLN at the groove 310, reduce a total amount of residual water in the planarization layer PLN, and reduce the erosion of the molecule of water on the light-emitting functional layer EL in a better manner, thereby to prolong the service life of the display panel. In addition, through the above-mentioned arrangement, the thickness of the planarization layer PLN in the direction perpendicular to the substrate may be effectively reduced at a region covered by the middle portion of the anode pattern 320, so it is able to reduce the volume of the planarization layer PLN, reduce a total amount of residual water in the planarization layer PLN, and reduce the erosion of the molecule of water on the light-emitting functional layer EL, thereby to prolong the service life of the display panel.

As shown in FIG. 13, in some embodiments of the present disclosure, each subpixel further includes: a second conductive connection member 909, at least a part of the second conductive connection member 909 extending in a second direction; an initialization signal line pattern 904, at least a part of the initialization signal line pattern 904 extending in a first direction crossing the second direction; and a resetting signal line pattern 905 extending in the first direction. The subpixel driving circuitry includes a seventh transistor, a gate electrode of which is coupled to the corresponding resetting signal line pattern 905, a first electrode of which is coupled to the corresponding initialization signal line pattern 904 through the second conductive connection member 909, and a second electrode of which is coupled to the corresponding anode pattern 320. An orthogonal projection of the second conductive connection member 909 onto the substrate overlaps the orthogonal projection of the groove 310 in the planarization layer PLN onto the substrate, and/or overlaps the orthogonal projection of the middle portion of the anode pattern 320 onto the substrate.

To be specific, the seventh transistor is used to transmit the initial signal from the initialization signal line pattern 904 to the corresponding anode pattern 320 under the control of the resetting signal from the resetting signal line pattern 905, so as to reset a potential on the anode pattern 320.

When the orthogonal projection of the second conductive connection member 909 onto the substrate overlaps the orthogonal projection of the groove 310 in the planarization layer PLN onto the substrate and/or overlaps the orthogonal projection of the middle portion of the anode pattern 320 onto the substrate, the thickness of the planarization layer PLN in the direction perpendicular to the substrate may be reduced at the groove 310. As a result, it is able to further narrow the diffusion channel of the molecular of water in the planarization layer PLN, reduce a release speed of the molecule of water in the planarization layer PLN in a better manner, and slow down the erosion of the molecule of water on the light-emitting functional layer EL, thereby to prolong the service life of the display panel.

In addition, through the above-mentioned arrangement, it is able to further reduce the volume of the planarization layer PLN at the groove 310, reduce the total amount of residual water in the planarization layer PLN, and reduce the erosion of the molecule of water on the light-emitting functional layer EL in a better manner, thereby to prolong the service life of the display panel. In addition, through the above-mentioned arrangement, the thickness of the planarization layer PLN in the direction perpendicular to the substrate may be effectively reduced at the region covered by the middle portion of the anode pattern 320, so it is able to reduce the volume of the planarization layer PLN, reduce the total amount of residual water in the planarization layer PLN, and reduce the erosion of the molecule of water on the light-emitting functional layer EL, thereby to prolong the service life of the display panel.

As shown in FIGS. 14 to 16, in some embodiments of the present disclosure, each subpixel further includes a pixel definition layer PDL arranged at a side of the anode pattern 320 away from the substrate and provided with a pixel opening, and an orthogonal projection of the pixel opening onto the substrate is located within the orthogonal projection of the anode pattern 320 onto the substrate.

To be specific, each subpixel further includes the pixel definition layer PDL at the side of the anode pattern 320 away from the substrate and provided with the pixel opening. Through the pixel opening, at least a part of the middle portion of the anode pattern 320 is exposed. In addition, the light-emitting functional layer EL is formed at a side of the pixel definition layer PDL away from the substrate, and a part of the light-emitting functional layer EL in the pixel opening is in contact with at least a part of the middle portion.

When the orthogonal projection of the pixel opening onto the substrate is located within the orthogonal projection of the middle portion of the anode pattern 320 onto the substrate, it is able to provide the light-emitting functional layer EL with a flat portion in contact with the anode pattern 320, thereby to ensure the yield of the light-emitting functional layer EL as well as a luminous effect.

In some embodiments of the present disclosure, the subpixels are arranged in an array form. Each subpixel further includes a power source signal line pattern 901, a data line pattern 908, an initialization signal line pattern 904, a gate line pattern 902, a light-emission control signal line pattern 903 and a resetting signal line pattern 905.

The subpixel driving circuitry includes a driving transistor, a first transistor, a second transistor, a fourth transistor, a fifth transistor, a sixth transistor and a seventh transistor.

A gate electrode of the driving transistor is coupled to a second electrode of the first transistor through the corresponding first conductive connection member, a first electrode of the driving transistor is coupled to a second electrode of the fifth transistor, and a second electrode of the driving transistor is coupled to a first electrode of the first transistor.

A gate electrode of the first transistor is coupled to the gate line pattern. A gate electrode of the second transistor is coupled to the resetting signal line pattern in a next adjacent subpixel in a second direction, a first electrode of the second transistor is coupled to the initialization signal line pattern in the next adjacent subpixel in the second direction, and a second electrode of the second transistor is coupled to the gate electrode of the driving transistor.

A gate electrode of the fourth transistor is coupled to the gate line pattern, a first electrode of the fourth transistor is coupled to the data line pattern, and a second electrode of the fourth transistor is coupled to the first electrode of the driving transistor.

A gate electrode of the fifth transistor is coupled to the light-emission control signal line pattern, and a first electrode of the fifth transistor is coupled to the power source signal line pattern.

A gate electrode of the sixth transistor is coupled to the light-emission control signal line pattern, a first electrode of the sixth transistor is coupled to the second electrode of the driving transistor, and a second electrode of the sixth transistor is coupled to a light-emitting element of the subpixel.

A gate electrode of the seventh transistor is coupled to the corresponding resetting signal line pattern, a first electrode of the seventh transistor is coupled to the corresponding initialization signal line pattern, and a second electrode of the seventh transistor is coupled to the corresponding anode pattern.

To be specific, as shown in FIGS. 1 and 3, the transistors of the subpixel driving circuitry are P-type transistors, the first electrode of each transistor is a source electrode, and the second electrode is a drain electrode.

The first transistor T1 is of a two-gate structure. A gate electrode 201$g$ of the first transistor T1 is coupled to the gate line pattern 902, a source electrode S1 of the first transistor T1 is coupled to a drain electrode D3 of the third transistor T3 (i.e., the driving transistor), and a drain electrode D1 of the first transistor T1 is coupled to a gate electrode 203$g$ of the third transistor T3.

The second transistor T2 is of a two-gate structure. A gate electrode 202$g$ of the second transistor T2 is coupled to the resetting signal line pattern 905' in a next adjacent subpixel in the second direction, a source electrode S2 of the second transistor T2 is coupled to the initialization signal line pattern 904' in the next adjacent subpixel, and a drain electrode D2 of the second transistor T2 is coupled to the gate electrode 203$g$ of the third transistor T3.

A gate electrode 204g of the fourth transistor T4 is coupled to the gate line pattern 902, a source electrode S4 of the fourth transistor T4 is coupled to the data line pattern 908, and a drain electrode D4 of the fourth transistor T4 is coupled to a source electrode S3 of the third transistor T3.

The gate electrode 205g of the fifth transistor T5 is coupled to the light-emission control signal line pattern 903, a source electrode S5 of the fifth transistor T5 is coupled to the power source signal line pattern 901, and a drain electrode T5 of the fifth transistor T5 is coupled to the source electrode S3 of the third driving transistor T3.

The gate electrode 206g of the sixth transistor T6 is coupled to the light-emission control signal line pattern 903, a source electrode S6 of the sixth transistor T6 is coupled to the drain electrode D3 of the third transistor T3, and a drain electrode D6 of the sixth transistor T6 is coupled to the anode pattern.

The gate electrode 207g of the seventh transistor T7 is coupled to the resetting signal line pattern 905, a drain electrode D7 of the seventh transistor T7 is coupled to the anode pattern, and a source electrode S7 of the seventh transistor T7 is coupled to the initialization signal line pattern 904.

A first electrode plate Cst1 of the storage capacitor Cst serves as the gate electrode 203g of the third transistor T3, and a second electrode plate Cst2 of the storage capacitor Cst is coupled to the power source signal line pattern 901.

The present disclosure further provides in some embodiments a display device including the above-mentioned display panel.

According to the display panel in the embodiments of the present disclosure, through the groove 310 in the surface of the planarization layer PLN away from the substrate, it is able to provide the planarization layer PLN with a structure having a convex middle portion. Meanwhile, when the orthogonal projection of the groove 310 onto the substrate surrounds the orthogonal projection of the middle portion onto the substrate and the orthogonal projection of at least a part of the peripheral portion onto the substrate is located within the orthogonal projection of the groove 310 onto the substrate, it is able for the anode pattern 320 to cover a part of the planarization layer PLN surrounded by the groove 310 and at least a part of the planarization layer PLN in the groove 310, as shown in FIG. 14. Through the above-mentioned arrangement, it is able to narrow the diffusion channel of the molecule of water inside the planarization layer PLN (e.g., in FIG. 14, a thickness of a portion of the planarization layer PLN at the groove bottom of the groove 310 is reduced relative to a thickness of the other portion of the planarization layer PLN), and prolong a diffusion path of the molecule of water toward the light-emitting functional layer EL (in FIG. 14, a dotted line with an arrow indicates the diffusion path). Hence, according to the display panel in the embodiments of the present disclosure, through narrowing the channel for the diffusion of the molecule of water in the planarization layer PLN and prolonging the diffusion path of the molecule of water in the planarization layer PLN, it is able to effectively reduce a release speed of the molecule of water in the planarization layer PLN and slow down the erosion of the molecule of water on the light-emitting functional layer EL, thereby to prolong a service life of the display panel. In addition, according to the display panel in the embodiments of the present disclosure, through the groove 310 in the surface of the planarization layer PLN away from the substrate, a thickness of the planarization layer PLN in the direction perpendicular to the substrate at the groove 310, and thereby a volume of the planarization layer PLN at the groove 310, may be reduced. As a result, it is able to reduce a total amount of residual water in the planarization layer PLN, and reduce the erosion of the molecule of water on the light-emitting functional layer EL, thereby to prolong the service life of the display panel.

Hence, when the display device includes the above-mentioned display panel, it also has the above-mentioned beneficial effects, which will not be particularly defined herein.

It should be appreciated that, the display device may be any product or member having a display function, e.g., a television, a display, a digital photo frame, a mobile phone or a tablet computer.

The present disclosure further provides in some embodiments a method for manufacturing a display panel, which includes forming a plurality of pixel units on a substrate, the plurality of pixel units being arranged in an array form, each pixel unit including a plurality of subpixels. Each subpixel includes a subpixel driving circuitry, a planarization layer PLN and an anode pattern 320 laminated one on another in a direction away from the substrate, each anode pattern 320 of at least a part of the subpixels includes a middle portion and a peripheral portion surrounding the middle portion, a groove 310 is formed in a surface of the planarization layer PLN away from the substrate, an orthogonal projection of the groove 310 onto the substrate surrounds an orthogonal projection of the middle portion onto the substrate, and at least a part of an orthogonal projection of the peripheral portion onto the substrate is located within the orthogonal projection of the groove 310 onto the substrate.

To be specific, the forming the subpixels in each subpixel unit includes forming the subpixel driving circuitry on the substrate, forming the planarization layer PLN at a side of the subpixel driving circuitry away from the substrate, forming the groove 310 in the planarization layer PLN, and forming the anode pattern 320 at a side of the planarization layer PLN away from the substrate.

According to the display panel manufactured through the above-mentioned method, through the groove 310 in the surface of the planarization layer PLN away from the substrate, it is able to provide the planarization layer PLN with a structure having a convex middle portion. Meanwhile, when the orthogonal projection of the groove 310 onto the substrate surrounds the orthogonal projection of the middle portion onto the substrate and the orthogonal projection of at least a part of the peripheral portion onto the substrate is located within the orthogonal projection of the groove 310 onto the substrate, it is able for the anode pattern 320 to cover a part of the planarization layer PLN surrounded by the groove 310 and at least a part of the planarization layer PLN in the groove 310, as shown in FIG. 14. Through the above-mentioned arrangement, it is able to narrow the diffusion channel of the molecule of water inside the planarization layer PLN (e.g., in FIG. 14, a thickness of a portion of the planarization layer PLN at a groove bottom of the groove 310 is reduced relative to a thickness of the other portion of the planarization layer PLN), and prolong a diffusion path of the molecule of water toward the light-emitting functional layer EL (in FIG. 14, a dotted line with an arrow indicates the diffusion path). Hence, according to the display panel in the embodiments of the present disclosure, through narrowing the channel for the diffusion of the molecule of water in the planarization layer PLN and prolonging the diffusion path of the molecule of water in the planarization layer PLN, it is able to effectively reduce a release speed of the molecule of water in the planarization layer PLN and slow down the erosion of the molecule of water on the light-emitting functional layer EL, thereby to prolong a service life of the display panel.

In addition, according to the display panel in the embodiments of the present disclosure, through the groove 310 in the surface of the planarization layer PLN away from the substrate, a thickness of the planarization layer PLN in the direction perpendicular to the substrate at the groove 310, and thereby a volume of the planarization layer PLN at the groove 310, may be reduced. As a result, it is able to reduce a total amount of residual water in the planarization layer PLN, and reduce the erosion of the molecule of water on the light-emitting functional layer EL, thereby to prolong the service life of the display panel.

In some embodiments of the present disclosure, each subpixel includes a power source signal line pattern 901 and a compensation pattern 906. The method further includes forming the power source signal line pattern 901 and the compensation pattern 906 simultaneously through a single patterning process. The compensation pattern 906 is arranged at a surface of the planarization layer PLN facing the substrate, and an orthogonal projection of the compensation pattern 906 onto the substrate overlaps at least a part of the orthogonal projection of the groove 310 in the planarization layer PLN onto the substrate, and/or overlaps the orthogonal projection of the middle portion of the anode pattern 320 onto the substrate.

To be specific, the power source signal line pattern 901 and the compensation pattern 906 may be formed integrally, so as to provide the compensation pattern 906 with a same stable potential as the power source signal line pattern 901, and form the compensation pattern 906 and the power source signal line pattern 901 through a single patterning process.

When the orthogonal projection of the compensation pattern 906 overlaps at least a part of the orthogonal projection of the groove 310 in the planarization layer PLN onto the substrate, it is able to further reduce the thickness of the planarization layer PLN in the direction perpendicular to the substrate at the groove 310, thereby to further narrow the diffusion channel of the molecule of water in the planarization layer PLN (e.g., in FIGS. 15 and 16, a thickness of a part of the planarization layer PLN at the groove bottom of the groove 310 is further reduced). Hence, according to the display panel in the embodiments of the present disclosure, through further narrowing the channel for the diffusion of the molecule of water in the planarization layer PLN, it is able to effectively reduce a release speed of the molecule of water in the planarization layer PLN and slow down the erosion of the molecule of water on the light-emitting functional layer EL in a better manner, thereby to prolong the service life of the display panel.

In addition, when the orthogonal projection of the compensation pattern 906 onto the substrate overlaps at least a part of the orthogonal projection of the groove 310 in the planarization layer PLN onto the substrate, the thickness of the planarization layer PLN in the direction perpendicular to the substrate at the groove 310, and thereby the volume of the planarization layer PLN at the groove 310, may be further reduced. As a result, it is able to reduce a total amount of residual water in the planarization layer PLN, and reduce the erosion of the molecule of water on the light-emitting functional layer EL in a better manner, thereby to prolong the service life of the display panel.

In addition, when the orthogonal projection of the compensation pattern 906 onto the substrate overlaps the orthogonal projection of the middle portion of the anode pattern 320 onto the substrate, the thickness of the planarization layer PLN in the direction perpendicular to the substrate at a region covered by the middle portion, and thereby the volume of the planarization layer PLN at the region covered by the middle portion, may be further reduced. As a result, it is able to reduce a total amount of residual water in the planarization layer PLN, and reduce the erosion of the molecule of water on the light-emitting functional layer EL in a better manner, thereby to prolong the service life of the display panel.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a substrate, and a plurality of pixel units arranged on the substrate in an array form and each comprising a plurality of subpixels, wherein each subpixel comprises a subpixel driving circuitry, a planarization layer and an anode pattern laminated one on another, each anode pattern of at least a part of the subpixels comprises a middle portion and a peripheral portion surrounding the middle portion, a groove is formed in a surface of the planarization layer away from the substrate, an orthogonal projection of the groove onto the substrate surrounds an orthogonal projection of the middle portion onto the substrate, and at least a part of an orthogonal projection of the peripheral portion onto the substrate is located within the orthogonal projection of the groove onto the substrate;

wherein the anode pattern is formed at a side of the planarization layer away from the substrate.

2. The display panel according to claim 1, wherein the groove comprises a groove bottom and a groove wall, and the orthogonal projection of the peripheral portion onto the substrate overlaps an orthogonal projection of the groove bottom of the groove onto the substrate.

3. The display panel according to claim 1, wherein each subpixel further comprises a compensation pattern arranged at a side of the planarization layer facing the substrate, and an orthogonal projection of the compensation pattern onto the substrate overlaps at least a part of the orthogonal projection of the groove in the planarization layer onto the substrate.

4. The display panel according to claim 3, wherein the orthogonal projection of the compensation pattern onto the substrate overlaps the orthogonal projection of the middle portion of the anode pattern onto the substrate.

5. The display panel according to claim 4, wherein each pixel unit comprises a red subpixel, a blue subpixel and a green subpixel, the red subpixel and the green subpixel are arranged in a same column in a second direction, and the blue subpixel is arranged in another column,
wherein the green subpixel comprises:
a first power source signal line pattern, at least a part of the first power source signal line pattern extending in the second direction;
a first compensation pattern coupled to the first power source signal line pattern and extending in a first direction, the first direction crossing the second direction; and
a first planarization layer, a first groove of a rectangular shape being formed in the first planarization layer, the first groove comprising a first portion and a second portion arranged opposite to each other in the second direction and a third portion and a fourth portion arranged opposite to each other in the first direction, an orthogonal projection of the first portion onto the substrate overlapping an orthogonal projection of the first compensation pattern onto the substrate.

6. The display panel according to claim 4, wherein each pixel unit comprise a red subpixel, a blue subpixel and a green subpixel, the red subpixel and the green subpixel are arranged in a same column in a second direction, and the blue subpixel is arranged in another column,
wherein the blue subpixel comprises:
a second power source signal line pattern, at least a part of the second power source signal line pattern extending in the second direction;
a second compensation pattern coupled to the second power source signal line pattern, protruding from the second power source signal line pattern in a first direction, and extending in the second direction; and
a second planarization layer, a second groove of a rectangular shape being formed in the second planarization layer, the second groove comprising a fifth portion and a sixth portion arranged opposite to each other in the second direction and a seventh portion and an eighth portion arranged opposite to each other in the first direction, an orthogonal projection of the seventh portion onto the substrate overlapping an orthogonal projection of the second compensation pattern onto the substrate.

7. The display panel according to claim 1, wherein each subpixel comprises a power source signal line pattern, at least a part of the power source signal line pattern extends in a second direction, the power source signal line pattern comprises a first power source member and a second power source member, the first power source member has a width greater than the second power source member in a direction perpendicular to the second direction, and an orthogonal projection of the first power source member onto the substrate overlaps the orthogonal projection of the middle portion of the anode pattern onto the substrate.

8. The display panel according to claim 1, wherein each subpixel further comprises: a power source signal line pattern, at least a part of the power source signal line pattern extending in a second direction; and a data line pattern, at least a part of the data line pattern extending in the second direction;
the subpixel driving circuitry comprises a driving transistor, and in one subpixel, an orthogonal projection of the power source signal line pattern onto the substrate is located between an orthogonal projection of an output electrode of the driving transistor onto the substrate and an orthogonal projection of the data line pattern onto the substrate;
the orthogonal projection of the power source signal line pattern onto the substrate overlaps the orthogonal projection of the groove in the planarization layer onto the substrate, and/or overlaps the orthogonal projection of the middle portion of the anode pattern onto the substrate; and
the orthogonal projection of the data line pattern onto the substrate overlaps the orthogonal projection of the groove in the planarization layer onto the substrate, and/or overlaps the orthogonal projection of the middle portion of the anode pattern onto the substrate.

9. The display panel according to claim 1, wherein each subpixel further comprises a first conductive connection member, and at least a part of the first conductive connection member extends in a second direction;
the subpixel driving circuitry comprises a driving transistor and a first transistor, a first electrode of the first transistor is coupled to a second electrode of the driving transistor, and a second electrode of the first transistor is coupled to a gate electrode of the driving transistor through the first conductive connection member; and
an orthogonal projection of the first conductive connection member onto the substrate overlaps the orthogonal projection of the groove in the planarization layer onto the substrate, and/or overlaps the orthogonal projection of the middle portion of the anode pattern onto the substrate.

10. The display panel according to claim 1, wherein each subpixel further comprises: a second conductive connection member, at least a part of the second conductive connection member extending in a second direction; an initialization signal line pattern, at least a part of the initialization signal line pattern extending in a first direction crossing the second direction; and a resetting signal line pattern extending in the first direction,
wherein the subpixel driving circuitry comprises a seventh transistor, a gate electrode of which is coupled to the corresponding resetting signal line pattern, a first electrode of which is coupled to the corresponding initialization signal line pattern through the second conductive connection member, and a second electrode of which is coupled to the corresponding anode pattern,
wherein an orthogonal projection of the second conductive connection member onto the substrate overlaps the orthogonal projection of the groove in the planarization layer onto the substrate, and/or overlaps the orthogonal projection of the middle portion of the anode pattern onto the substrate.

11. The display panel according to claim 1, wherein each subpixel further comprises a pixel definition layer arranged at a side of the anode pattern away from the substrate and provided with a pixel opening, and an orthogonal projection of the pixel opening onto the substrate is located within the orthogonal projection of the anode pattern onto the substrate.

12. The display panel according to claim 1, wherein the subpixels are arranged in an array form;
   each subpixel further comprises a power source signal line pattern, a data line pattern, an initialization signal line pattern, a gate line pattern, a light-emission control signal line pattern, a resetting signal line pattern and a first conductive connection member;
   the subpixel driving circuitry comprises a driving transistor, a first transistor, a second transistor, a fourth transistor, a fifth transistor, a sixth transistor and a seventh transistor;
   a gate electrode of the driving transistor is coupled to a second electrode of the first transistor through the corresponding first conductive connection member, a first electrode of the driving transistor is coupled to a second electrode of the fifth transistor, and a second electrode of the driving transistor is coupled to a first electrode of the first transistor;
   a gate electrode of the first transistor is coupled to the gate line pattern;
   a gate electrode of the second transistor is coupled to the resetting signal line pattern in a next adjacent subpixel in a second direction, a first electrode of the second transistor is coupled to the initialization signal line pattern in the next adjacent subpixel in the second direction, and a second electrode of the second transistor is coupled to the gate electrode of the driving transistor;
   a gate electrode of the fourth transistor is coupled to the gate line pattern, a first electrode of the fourth transistor is coupled to the data line pattern, and a second electrode of the fourth transistor is coupled to the first electrode of the driving transistor;
   a gate electrode of the fifth transistor is coupled to the light-emission control signal line pattern, and a first electrode of the fifth transistor is coupled to the power source signal line pattern;
   a gate electrode of the sixth transistor is coupled to the light-emission control signal line pattern, a first electrode of the sixth transistor is coupled to the second electrode of the driving transistor, and a second electrode of the sixth transistor is coupled to a light-emitting element of the subpixel; and
   a gate electrode of the seventh transistor is coupled to the corresponding resetting signal line pattern, a first electrode of the seventh transistor is coupled to the corresponding initialization signal line pattern, and a second electrode of the seventh transistor is coupled to the corresponding anode pattern.

13. A display device, comprising the display panel according to claim 1.

14. A method for manufacturing a display panel, comprising forming a plurality of pixel units on a substrate, the plurality of pixel units being arranged in an array form, each pixel unit comprising a plurality of subpixels, wherein each subpixel comprises a subpixel driving circuitry, a planarization layer and an anode pattern laminated one on another in a direction away from the substrate, each anode pattern of at least a part of the subpixels comprises a middle portion and a peripheral portion surrounding the middle portion, a groove is formed in a surface of the planarization layer away from the substrate, an orthogonal projection of the groove onto the substrate surrounds an orthogonal projection of the middle portion onto the substrate, and at least a part of an orthogonal projection of the peripheral portion onto the substrate is located within the orthogonal projection of the groove onto the substrate;
   wherein the anode pattern is formed at a side of the planarization layer away from the substrate.

15. The method according to claim 14, wherein each subpixel comprises a power source signal line pattern and a compensation pattern, the method further comprises forming the power source signal line pattern and the compensation pattern simultaneously through a single patterning process, the compensation pattern is arranged at a surface of the planarization layer facing the substrate, and an orthogonal projection of the compensation pattern onto the substrate overlaps at least a part of the orthogonal projection of the groove in the planarization layer onto the substrate.

16. The method according to claim 14, wherein each subpixel comprises a power source signal line pattern and a compensation pattern, the method further comprises forming the power source signal line pattern and the compensation pattern simultaneously through a single patterning process, the compensation pattern is arranged at a surface of the planarization layer facing the substrate, and an orthogonal projection of the compensation pattern onto the substrate overlaps the orthogonal projection of the middle portion of the anode pattern onto the substrate.

17. The display device according to claim 13, wherein the groove comprises a groove bottom and a groove wall, and the orthogonal projection of the peripheral portion onto the substrate overlaps an orthogonal projection of the groove bottom of the groove onto the substrate.

18. The display device according to claim 13, wherein each subpixel further comprises a compensation pattern arranged at a side of the planarization layer facing the substrate, and an orthogonal projection of the compensation pattern onto the substrate overlaps at least a part of the orthogonal projection of the groove in the planarization layer onto the substrate.

19. The display device according to claim 18, wherein the orthogonal projection of the compensation pattern onto the substrate overlaps the orthogonal projection of the middle portion of the anode pattern onto the substrate.

20. The display device according to claim 19, wherein each pixel unit comprises a red subpixel, a blue subpixel and a green subpixel, the red subpixel and the green subpixel are arranged in a same column in a second direction, and the blue subpixel is arranged in another column,
   wherein the green subpixel comprises:
   a first power source signal line pattern, at least a part of the first power source signal line pattern extending in the second direction;
   a first compensation pattern coupled to the first power source signal line pattern and extending in a first direction, the first direction crossing the second direction; and
   a first planarization layer, a first groove of a rectangular shape being formed in the first planarization layer, the first groove comprising a first portion and a second portion arranged opposite to each other in the second direction and a third portion and a fourth portion arranged opposite to each other in the first direction, an orthogonal projection of the first portion onto the substrate overlapping an orthogonal projection of the first compensation pattern onto the substrate.

* * * * *